(12) United States Patent
Scarsbrook et al.

(10) Patent No.: US 7,981,721 B2
(45) Date of Patent: Jul. 19, 2011

(54) DIAMOND TRANSISTOR AND METHOD OF MANUFACTURE THEREOF

(75) Inventors: Geoffrey Alan Scarsbrook, Ascot (GB); Daniel James Twitchen, Ascot (GB); Christopher John Howard Wort, Wantage (GB); Michael Schwitters, Oslo (NO); Erhard Kohn, Ulm (DE)

(73) Assignee: Diamond Microwave Devices Limited, Leeds (GB)

( * ) Notice: Subject to any disclaimer, the term of this patent is extended or adjusted under 35 U.S.C. 154(b) by 215 days.

(21) Appl. No.: 11/912,414

(22) PCT Filed: Apr. 28, 2006

(86) PCT No.: PCT/IB2006/001054
§ 371 (c)(1),
(2), (4) Date: Oct. 29, 2007

(87) PCT Pub. No.: WO2006/117621
PCT Pub. Date: Nov. 9, 2006

(65) Prior Publication Data
US 2008/0099768 A1    May 1, 2008

(30) Foreign Application Priority Data
Apr. 29, 2005  (GB) .................................. 0508889.3

(51) Int. Cl.
*H01L 29/12* (2006.01)
*H01L 29/30* (2006.01)

(52) U.S. Cl. .................. 438/105; 257/77; 257/E21.001

(58) Field of Classification Search .................. 438/105, 438/142, 167, 197; 257/77, E21.001, 213, 257/288
See application file for complete search history.

(56) References Cited

U.S. PATENT DOCUMENTS

| | | | | |
|---|---|---|---|---|
| 5,127,983 A | * | 7/1992 | Imai et al. ........................ | 117/85 |
| 5,584,045 A | * | 12/1996 | Tanabe et al. .................. | 428/547 |
| 5,886,389 A | * | 3/1999 | Niwa ............................. | 257/401 |
| 5,903,015 A | * | 5/1999 | Shiomi et al. ................... | 257/77 |
| 2004/0180205 A1 | * | 9/2004 | Scarsbrook et al. .......... | 428/408 |
| 2004/0229464 A1 | * | 11/2004 | Godfried et al. .............. | 438/689 |

(Continued)

OTHER PUBLICATIONS

Shiomi et al., "Pulse-Doped Diamond P-Channel Metal Semiconductor Field-Effect Transistor", IEEE Electron Device Letters vol. 16, No. 1 (1995): pp. 36-38.*

(Continued)

*Primary Examiner* — Matthew Smith
*Assistant Examiner* — Michele Fan
(74) *Attorney, Agent, or Firm* — Oblon, Spivak, McClelland, Maier & Neustadt, L.L.P.

(57) ABSTRACT

A method of manufacturing a transistor, typically a MESFET, includes providing a substrate including single crystal diamond material having a growth surface on which further layers of diamond material can be deposited. The substrate is preferably formed by a CVD process and has high purity. The growth surface has a root-mean-square roughness of 3 nm or less, or is free of steps or protrusions larger than 3 nm. Further diamond layers are deposited on the growth surface to define the active regions of the transistor. An optional n+ shielding layer can be formed in or on the substrate, following which an additional layer of high purity diamond is deposited. A layer of intrinsic diamond may be formed directly on the upper surface of the high purity layer, followed by a boron doped ("delta doped") layer. A trench is formed in the delta doped layer to define a gate region.

78 Claims, 9 Drawing Sheets

U.S. PATENT DOCUMENTS

2006/0163584 A1* 7/2006 Linares .................... 257/77

OTHER PUBLICATIONS

Aleksov et al., "Diamond Power FET Concept", IEEE (2000): pp. 266-273.*

Denisenko, et al., "Diamond power devices. Concepts and Limits", Diamond and Related Materials, vol. 14, No. 3-7, pp. 491-498, XP004857108, 2005.

Kawakami, et al., "Fabrication of a submicron source-drain gap for p-i-p field effect transistors using epitaxial diamond layers", Daimond and Related Materials, vol. 13, No. 11-12, pp. 1939-1943, XP004614807, 2004.

Aleksov, et al., "Diamond field effect transistors—concepts and challenges", Diamond and Related Materials, vol. 12, No. 3-7, pp. 391-398, XP004423684, 2003.

* cited by examiner

DIAMOND TRANSISTOR AND METHOD OF MANUFACTURE THEREOF

BACKGROUND OF THE INVENTION

This invention relates to transistors, particularly field effect transistors (FETs), formed from diamond material and to methods of manufacturing such transistors.

The generation of high frequency (HF) and microwave signals is now mostly based on silicon and gallium arsenide devices. Due to physical limitations, these devices cannot achieve power levels higher than a few hundred watts (depending on the frequency to be amplified) in simple solid-state device configurations. Wide band-gap materials (diamond, SiC, GaN, etc) in principle allow for higher power amplification per unit gate length at microwave frequencies. This is because a larger bias voltage, and hence the voltage amplitude on the microwave signal, can be supported across the transistor channel region over which the current is modulated. In effect, the higher breakdown electric field of a wide band-gap semiconductor is exploited. In microwave power transistors, the ability to support high voltage is particularly desirable, since, generally, power has to be transferred to a relatively high impedance (50Ω) load.

The use of diamond in manufacturing transistors of this kind has been described in the following publications: JP-A-60246627, EP 0 343 963 B1 and US005491348A).

It is an object of the invention to provide an alternative transistor structure and method of manufacture thereof with particular advantages in terms of ease of manufacture and performance.

SUMMARY OF THE INVENTION

According to one aspect of the invention a method of manufacturing a transistor includes the steps of:
(a) providing a substrate comprising single crystal diamond material having a growth surface on which further layers of diamond material can be deposited, the growth surface or a region thereof having a root-mean-square roughness of 3 nm or less or being free of steps or protrusions larger than 3 nm;
(b) depositing a plurality of further diamond layers on the substrate growth surface; and
(c) attaching appropriate contacts to the respective diamond layers, thereby defining a transistor structure.

In one embodiment of the invention, the growth surface of the substrate or region thereof preferably has a root-mean-square (rms) roughness (or $R_Q$) of less than 1 nm, more preferably less than 0.1 nm and most preferably less than 0.05 nm. As $R_A$ and $R_Q$ are used extensively through this application, it is worth stating the relationship between them: for a Gaussian distribution of surface heights, $R_Q=1.25 R_A$.

The surface of the substrate may be further characterised by its $R_T$ value, where this is the maximum peak-to-valley height measured. A surface with low $R_A$ or $R_Q$ may still be unsuitable by virtue of the presence of small numbers of deep pits or tall hillocks on the surface giving a large $R_T$ value. It is preferred that the $R_T$ value of the substrate is less than 3 nm, more preferably less than 1 nm, more preferably still less than 0.5 nm and most preferably less than 0.2 nm.

The lateral extent of the area required to meet the rms, $R_Q$, $R_A$ and $R_T$ roughness requirement is preferably defined by the lateral extent of the device or an assembly of electrically connected devices, or more preferably twice these lateral dimensions and most preferably three times these lateral dimensions.

The device includes source, drain, gate, channel and contact regions as is conventionally understood in the art.

An assembly of electrically connected devices refers to two or more devices connected in such a way that they behave as a single device with electrical characteristics (in particular total power and total current handling capacity) that are greater than those of a single device.

In terms of absolute dimensions, individual devices can have lateral dimensions of as little as 1 μm×1 μm. An assembly might encompass the whole of a wafer of diamond; it is conceivable that in the future this might be 100 mm×100 mm or even larger.

The high flatness or smoothness of the growth surface is required to provide a suitable surface for the subsequent thin device layers to be fabricated thereon. In many applications the key parameter rather than the rms roughness is the absence of steps above a specific size, typically some fraction of the thickness of the thinnest subsequent layer used in the structure before any optional further flatness processing is applied.

Thus, in an alternative embodiment of the invention, the height of any step or protrusion is preferably less than 50% of the thinnest adjacent layer thickness, more preferably less than 20%, even more preferably less than 10%, even more preferably less than 5%, and most preferably less than 2%, where a step or protrusion is defined as the change in height of the surface over a distance, parallel to the surface, equal to or greater than the thickness of the thinnest adjacent layer.

Preferably, the step or protrusion is defined as the change in height of the surface over a distance, parallel to the surface, equal to at least twice, and more preferably 5 times, and most preferably 10 times the thickness of the thinnest adjacent layer.

In other words this means that the sharpness of the interface between two adjacent layers in the transistor structure should be smaller than the Debye-length of the material.

Since in many device structures the critical gate structure is a line or similar linear structure, there is benefit in providing a surface which has a lower surface roughness or lower maximum step height along a particular direction, compared to the orthogonal direction on the surface, where this direction is then the direction of the major dimension of such linear feature, for example the direction in which the gate is extended laterally.

Thus, according to a further embodiment of the invention, the growth surface preferably has a lower surface roughness or lower maximum step height along a particular direction, which direction corresponds to the linear dimension of a contact or other linear feature of the transistor.

Specifically, it is preferred that the gate length or another linear feature of the transistor is arranged in a direction corresponding to the direction of the surface of the substrate that has the lower surface roughness or lower maximum step height.

From the above it is evident that the provision of a substrate having a smooth surface for diamond growth is an important feature of the invention. This in itself includes careful selection of the substrate material to be used, and processing of the substrate surface to the desired smoothness.

The substrate material is typically single crystal diamond material characterised by low strain, low birefringence and low dislocation density.

The diamond of the substrate material can be HPHT, CVD or natural diamond, HPHT and CVD diamond being preferred.

The substrate material is more preferably single crystal diamond material prepared by a chemical vapour deposition technique (referred to as 'CVD diamond') that is characterized by low strain, low birefringence and low dislocation density.

The characteristics of low strain, low birefringence (which is indicative of low strain), low dislocation density and the methods of making measurements of such characteristics have previously been described by the applicant in WO 2004/046427 and WO 2004/027123, the contents of which are herein incorporated by reference, together with methods of making such material.

Typical values of the characteristics include:
a) Birefringence, exemplified by the modulus of the sine of the phase shift, being less than 0.9;
b) A dislocation density, measured by use of 'revealing etch', of preferably less than $5 \times 10^3/mm^2$, more preferably less $1 \times 10^3/mm^2$, more preferably still less than $5 \times 10^2/mm^2$ and most preferably less than $10^2/mm^2$.
c) The surface of the material is capable of being polished to an $R_A$ of preferably better than 1 nm and more preferably better than 0.6 nm. This does not specify the $R_A$ that is required for making the device but does specify the nature of the material required as some CVD cannot be processed to such a surface finish because of its density of point and extended defects.
d) The concentration of single substitutional nitrogen in a CVD substrate as measured by the technique of electron paramagnetic resonance is preferably less than $5 \times 10^{17}$ cm$^{-3}$, more preferably less than $2 \times 10^{17}$ cm$^{-3}$.
e) The concentration of single substitutional nitrogen in a CVD substrate as measured by the technique of electron paramagnetic resonance is preferably greater than $3 \times 10^{15}$ cm$^3$, more preferably greater than $1 \times 10^{16}$ cm$^{-3}$ and most preferably greater than $5 \times 10^{16}$ cm$^{-3}$.

Whilst substrate material with such characteristics is preferred, the use of material from outside the above ranges to make the devices of the invention is not excluded, and it should be noted that the ranges of values are simply intended as indications of the characteristics of the material that will yield devices with the best performance.

Although the preferred substrate material is single crystal CVD diamond with the characteristics described above, it is also possible to use other synthetic diamond or natural diamond. Other synthetic diamond might include diamond synthesised by high pressure-high temperature techniques ('HPHT diamond'). Within the scope of this invention is included, as an alternative embodiment, the use of HPHT diamond as a substrate upon which high quality layers with the same characteristics as listed above are grown prior to the preparation of subsequent electronically active layers.

Whilst it is possible that polycrystalline CVD diamond or highly oriented polycrystalline diamond might be used as the diamond substrate for this invention, neither are preferred options.

Diamond being a crystalline material can be characterised in crystallographic terms, in particular the Miller indices of planes, either as (hkl) or {hlk}, and directions [uvw] or <uvw>, where the meanings of the different types of types of bracket are as conventionally known in the art.

The primary growth sectors for CVD diamond synthesis are any low index planes including {100}, {110}, {111}, {311} and {331}. In one embodiment it is preferred that a diamond plate used as a substrate has as its major surface a plane that is preferably within 15°, more preferably within 10°, even more preferably within 7° and most preferably within 4° of a {100}, {110}, {111} or {311} plane.

For convenience the preferred {100} plane will be referred to as (001) and have a plane normal in the direction [001].

It is possible to process diamond plates such that the normal to surface of the plate is deliberately at an angle to a crystallographic plane. Such processing or polishing is referred to as 'off-axis' processing or polishing. Off-axis polishing allows the surface roughness to be lower after CVD diamond growth because it provides direction to the general flow of atomic steps, these steps being the edges of atomic planes.

In a preferred embodiment of the invention, the diamond substrate is prepared such that the normal to the major surface is preferably less than 15° from the [001] direction, and more preferably less 7° from the [001] direction, and preferably in a direction that lies within 15°, more preferably within 10°, even more preferably within 7° and most preferably within 4°, of the great circle passing through the selected (001) primary sector and either the (a) (111) and (110) crystallographic orientations or the (b) (-111) and (-110) crystallographic orientations. In case (a) the gate length of the transistor is advantageously aligned parallel to the direction [-110] and in case (b) parallel to the direction [110].

Substrate material produced by CVD diamond growth is particularly preferred, as it provides substantial control over a number of parameters that are relevant to reducing dislocation density and improving the ability of the surface to be processed to high smoothness, such as growing the diamond material in the presence of a controlled low level of nitrogen, for example.

In this regard, whilst the single crystal diamond material comprising the substrate, particularly that near the growth surface made smooth for further device fabrication, is required to be compatible with the device in terms of its electronic properties, as the substrate does not generally constitute an active layer of the device (except in terms of the possible presence of a shielding layer or use of a 'back contact' configuration) the quality criteria are less stringent than those on the device layers, and non-electronic grades of diamond may be used.

For example, so-called optical grade CVD single crystal diamond, as disclosed in WO 2004/046427, has been found to be particularly suitable as a substrate material for carrying out the method of the present invention.

The level of nitrogen used in the method of producing the substrate is preferably selected to be sufficient to prevent or reduce local strain generating defects whilst being low enough to prevent or reduce deleterious absorptions and crystal quality degradation. It has been found by experiment that in order to achieve the above desired characteristics the atmosphere in which the CVD synthesis occurs preferably contains at least 300 ppb (parts per billion) of nitrogen, more preferably at least 500 ppb and most preferably at least 800 ppb and preferably less than 5 ppm (parts per million), more preferably less than 2 ppm and most preferably less than 1.5 ppb, all calculated as molecular nitrogen.

A further aspect of the substrate is that it may comprise in whole or in part an n+ shielding layer, the shielding layer being typically doped with nitrogen or phosphorous. The use of such a shielding layer is an alternative to the use of a back contact.

The concentration of n-type dopants, i.e. nitrogen or phosphorus, in the shielding layer is typically in the range $1 \times 10^{15}$ cm$^{-3}$ to $1 \times 10^{20}$ cm$^{-3}$. Whilst the thickness of this layer in configurations where it is employed is not critical, it is preferred that its thickness is between 1 nm and 5 mm. Thin shielding layers (typically more than 1 nm and less than 150 µm in thickness) are preferred when the shielding layer does not comprise the whole of the substrate (i.e. it is a discrete layer distinguishable from the substrate by its nitrogen and/or phosphorus concentration). Thick shielding layers (typically greater than 150 μm and less than 5 mm in thickness) are preferred in configurations where the substrate constitutes the shielding layer (i.e. there is no distinction in terms of the nitrogen and/or phosphorus concentration between the shielding layer and the substrate).

In an alternative embodiment, the shielding layer could be fabricated by an ion implantation process.

Within the shielding layer the dopant concentration may be fixed, or it may vary linearly from one surface to the other, or it may follow some other suitable dopant concentration profile or property profile. The shielding layer is normally adjacent or close to the surface onto which the device structures will be grown. The shielding layer may be provided by CVD diamond growth, or by implantation, or by use of a pre-doped layer of diamond from any suitable source, onto which further diamond is attached by CVD methods to provide the bulk of the substrate, or may comprise the whole of the substrate and thus be diamond from any suitable source.

Processing of the substrate surface to the desired smoothness may be carried out in a number of ways. It may entail a mechanical processing route using conventional lapping and polishing techniques in combination with careful surface characterization. It can also be achieved by controlled etching and or growth techniques, for example plasma etching or low rate growth, in some instances in combination with a developed mechanical polishing route. Use can also be made of off-axis polishing combined with controlled etching or more preferably controlled growth to provide additional control of the motion of surface steps during the etch/growth process and thus a surface which is smoother, optionally after subsequent mechanical processing.

An off-axis polishing technique followed by etching or growth is particularly preferred in the case where the surface smoothness is distinct in different directions, typically two orthogonal directions.

The further diamond layers are preferably deposited (grown) on the substrate by CVD diamond growth under conditions suitable to produce high quality diamond.

In a preferred embodiment of the invention, the CVD growth of high quality diamond typically comprises an in-situ pre-growth etch of the substrate followed by deposition. The etch may comprise of two stages, first an oxygen etch and then a hydrogen etch.

As it is important to retain the smoothness provided by prior processing, the etch is preferably predominantly or wholly a hydrogen etch. Details of suitable etching conditions have previously been disclosed in WO 01/96633.

In alternative embodiments of the invention the substrate may be subjected to other etching techniques prior to the CVD growth process including inductively coupled plasma (ICP) etching, ion beam milling (IBM) and reactive ion etching (RIE). These techniques may be employed either ex-situ or in-situ of the growth chamber. Either or both of these etches may be succeeded by either or both of the oxygen and hydrogen plasma etches of the preferred embodiment described above.

The method may include depositing at least one layer of doped diamond material and depositing at least one layer of intrinsic diamond material defining a channel on the layer of doped diamond material.

The further diamond layers deposited (grown) on the substrate preferably include at least one boron doped layer (a 'delta-doped' layer) and at least one adjacent layer of device grade diamond, with sharply defined interfaces between the respective layers.

The delta-doped layer preferably has a dopant concentration greater than $1\times10^{16}$ atoms $cm^{-3}$, and more preferably greater than $1\times10^{18}$ atoms $cm^{-3}$, and more preferably greater than $1\times10^{19}$ atoms $cm^{-3}$, and more preferably greater than $5\times10^{19}$ atoms $cm^{-3}$, and more preferably greater than $1\times10^{20}$ atoms $cm^{-3}$, and most preferably greater than $5\times10^{20}$ atoms $cm^{-3}$.

The delta-doped layer preferably has a dopant concentration of less than $5\times10^{21}$ atoms $cm^{-3}$, more preferably less than $1\times10^{21}$ atoms $cm^{-3}$ and most preferably less than $8\times10^{20}$ atoms $cm^{-3}$.

The device grade high purity diamond preferably comprises high purity diamond with a residual impurity concentration of less than $1\times10^{16}$ $cm^{-3}$, more preferably less than $1\times10^{15}$ $cm^{-3}$, still more preferably less than $1\times10^{14}$ $cm^{-3}$ and most preferably less than $5\times10^{13}$ $cm^{-3}$. This diamond will be referred to in this document as intrinsic diamond.

The interface between respective layers is preferably smooth, with a maximum step or protrusion height as hereinbefore defined for the substrate surface.

Ideally the interface between a doped layer and an undoped layer, where the undoped layer is deposited on top of the doped layer, should be perfectly sharp, the dopant concentration changing sharply as the interface is crossed. In reality such perfection is not realisable and when an undoped layer is deposited on a doped layer, the dopant level will decrease to that which is compatible with a layer being undoped over a finite distance.

The doping concentration should fall by at least 1, but more preferably at least 3, even more preferably at least 5 and most preferably at least 7 orders of magnitude in a distance less than 20%, more preferably less than 10%, more preferably less than 5%, or even more preferably less than 2% or most preferably less than 1% of the layer thickness between a doped and an undoped layer, where the layer thickness is that of the undoped layer which is deposited on the doped layer.

In the case of a doped layer deposited on an intrinsic layer, the dopant concentration should rise to the desired level as rapidly possible over as short a distance as possible, with a perfectly sharp transition being the ideal case. However ideality is not achievable in reality and therefore it is preferred that the dopant concentration rises from the level of the intrinsic layer (typically less than $10^{16}$ $cm^{-3}$) to at least $1\times10^{18}$ $cm^{-3}$, more preferably at least $1\times10^{19}$ $cm^{-3}$, even more preferably at least $1\times10^{20}$ $cm^{-3}$, even more preferably still at least $5\times10^{20}$ $cm^{-3}$, and most preferably at least $1\times10^{21}$ $cm^{-3}$; in a distance of preferably less than 10 nm, more preferably less than 5 nm, even more preferably less than 2 nm, even more preferably still less than 1 nm, even more preferably still less than 0.5 nm and most preferably 0.1 nm.

Ideally the doped layer has a thickness equaling monolayer-thickness. This is difficult to achieve in practice and can be compromised by roughness on the surface of the intrinsic layer on which the doped layer is being deposited.

The thickness of the boron delta doped diamond layer(s) (layers 3 and 5 in FIG. 2) is preferably less than 100 nm, more preferably less than 50 nm, more preferably less than 20 nm, more preferably less than 10 nm, even more preferably less than 5 nm, even more preferably less than 2 nm, even more preferably less than 1 nm, and most preferably less than 0.3 nm. Ideally the doped layer has a thickness equaling that of a monolayer.

The thickness of the intrinsic diamond layer(s) defining the channel is preferably less than 1000 nm, more preferably less than 200 nm, even more preferably less than 100 nm, even more preferably less than 50 nm, even more preferably less than 20 nm, even more preferably less than 10 nm, even more preferably less than 5 nm and most preferably less than 2 nm. The thickness of the intrinsic diamond layer(s) defining the channel has to be thicker than the Debye-tail. The thickness of the intrinsic diamond layer(s) defining the channel has to be thicker than the Debye-tail.

A further preferred embodiment of the invention includes the provision of a Schottky gate contact, generally positioned in a recess in contact with the channel. The channel can be recessed and exposed using processing techniques such as laser ablation, induced graphitisation and chemical etching, reactive ion etching, ion beam milling or inductive coupled plasma processing in combination with lithography techniques, for example.

The gate contact may comprise a metallisation layer utilizing nickel, aluminium, gold or platinum, for example, or a refractory metal In addition to the gate contact, it is generally also necessary to deposit at least two ohmic source and drain contacts per device.

The ohmic contacts are deposited either directly on a first doped layer or onto a second doped layer and make contact to the first doped layer through carrier diffusion, which contacts typically form a very low resistance contact to the doped layer. This can be achieved using a number of techniques, including forming a tunneling contact through a metal carbide interface. Typical metals and other materials that do this include titanium, chromium, nickel and tungsten silicide (WSi). These materials, for reasons associated with coupling the device to some external circuitry, may be capped with some other metals including platinum, gold and aluminium.

In a further embodiment of the invention a layer of diamond or non-diamond passivating material, which provides additional isolation between the Schottky gate and the two ohmic contacts, is provided. It preferably comprises a wide band-gap material and may; for example, be one or more of sapphire, n-type diamond, intrinsic diamond, silicon oxide, silicon carbide, gallium nitride, aluminium nitride, gallium aluminium nitride and boron nitride.

The gate contact is preferably a Schottky gate contact applied to the layer of passivating material, although the gate in certain cases may be applied directly to the exposed channel.

The method of the invention may include the use of controlled isotopic ratios to control the strain between adjacent layers, or the build up of strain generally throughout the layer structure of the device. In particular, the ratio of $^{12}C$ and $^{13}C$ may be adjusted, or the isotopic ratio of the doping atoms (e.g. $^{10}B:^{11}B$) in the different layers or within layers, or at the boundaries of layers, where here the concept of a layer is then defined by the chemical rather than isotopic composition.

The invention extends to field effect transistors ('MESFETs') manufactured by the above defined methods.

The high frequency MESFETs that result from the use of the materials and methods described in this application have been modelled using sophisticated modelling techniques and real data on the properties of the materials. This is in part because the cycle time of synthesis and testing of these devices is long, and to cover the full ranges of devices possible would require substantially greater than a year.

The two key parameters that characterise a MESFET are the threshold frequency $F_T$ and the maximum output power at $F_T$, $P_{max}$, in W/mm of gate length. For the SC CVD diamond MESFETs of the invention, it is expected that the threshold frequency $F_T$ for the devices will be in the range from 0.1 GHz to 500 GHz and that the power $P_{max}$ will range from 0.05 W/mm to 1000 W/mm. As the threshold frequency of a MESFET rises, the power capacity generally falls, therefore the best method of characterising the performance of the device is as product of $P_{max} \times F_T$. Consequently the following performance figures are expected to be realised following the method of this invention:

For a device with a threshold frequency $F_T$ in the range 0.1 to 500 GHz and a maximum output power $P_{max}$ lying in the range 0.05 W/mm to 1 000 W/mm, the product of threshold frequency in GHz and maximum power in W/mm, $F_T \times P_{max}$, is preferably greater than 0.005, more preferably greater than 0.05, more preferably greater than 0.5, more preferably still greater than 5, even more preferably greater than 50, even more preferably greater than 500, even more preferably still greater than 5 000 and most preferably greater than 50 000.

For a device with a threshold frequency $F_T$ in the range 0.1 to 500 GHz and a maximum output power $P_{max}$ lying in the range 0.05 W/mm to 1 000 W/mm, the product of threshold frequency in GHz and maximum power in W/mm, $F_T \times P_{max}$, preferably does not exceed $10^6$, more preferably does not exceed $10^5$, even more preferably does not exceed $10^4$ and most preferably does not exceed $10^3$.

For a finished device, the gate length (and therefore $P_{max}$ in W/mm of gate length) may not be readily accessible and therefore the device performance can be expressed in terms of the product of the threshold frequency in GHz, $F_T$, and the device's maximum output power in W, $P_{dev}$. The expected performance of the devices of the invention are as follows:

For a device with a threshold frequency $F_T$ in the range 0.1 to 500 GHz and a maximum output power $P_{max}$ lying in the range 0.05 W/mm to 1 000 W/mm, the product of threshold frequency in GHz and the device's maximum power in W, $F_T \times P_{dev}$, is preferably greater than 0.005, more preferably greater than 0.05, more preferably greater than 0.5, more preferably still greater than 5, even more preferably greater than 50, even more preferably greater than 500, even more preferably still greater than 5 000 and most preferably greater than 50 000.

For a device with a threshold frequency $F_T$ in the range 0.1 to 500 GHz and a maximum output power $P_{max}$ lying in the range 0.05 W/mm to 1 000 W/mm, the product of threshold frequency in GHz and the device's maximum power in W, $F_T \times P_{dev}$, preferably does not exceed $10^6$, more preferably does not exceed $10^5$, even more preferably does not exceed $10^4$ and most preferably does not exceed $10^3$.

DESCRIPTION OF EMBODIMENTS

Figure 1:
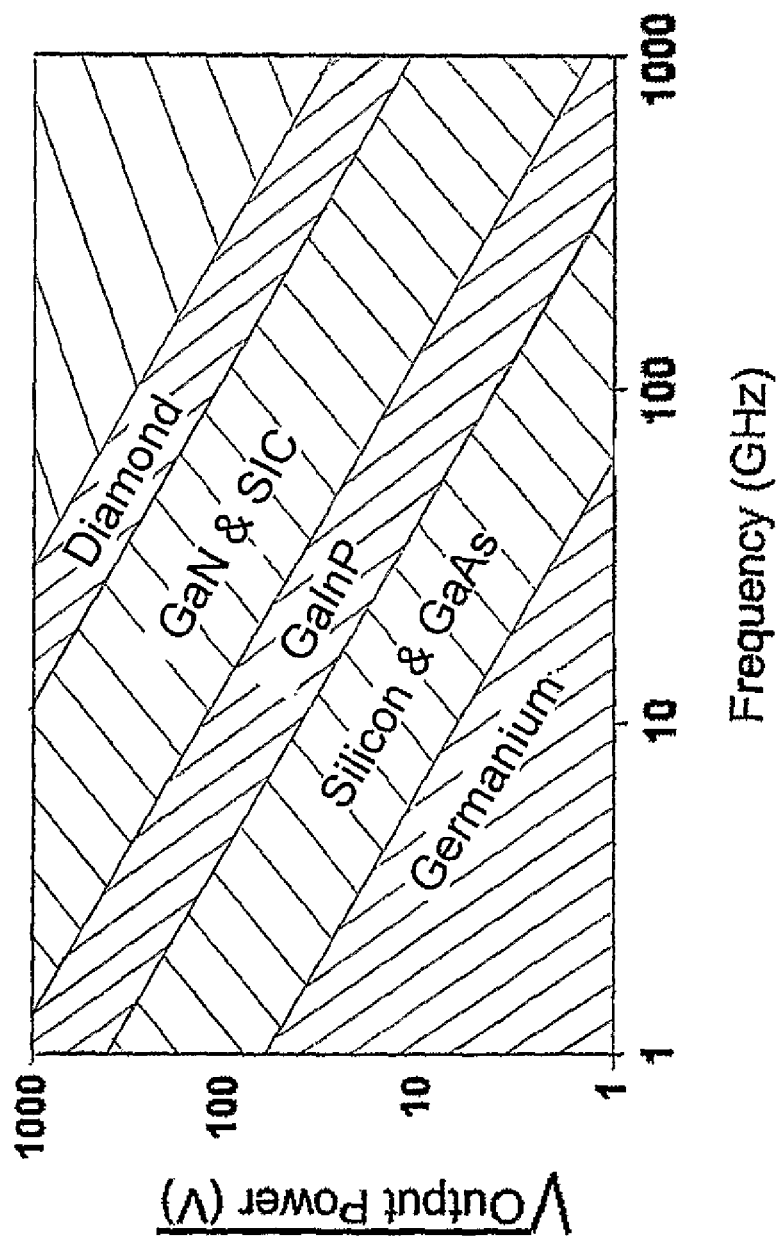
FIG. 1 is a diagram showing output power achievable as a function of frequency for various different semiconductor materials.

Wide-band gap materials such as GaN, SiC and diamond all offer the potential for high power solid-state radio frequency (RF) devices in simple device configurations, and of these materials diamond has by far the best material characteristics (see FIG. 1).

Theoretically, the intrinsic performance of diamond suggests that diamond devices could take the entire RF generation market at frequencies up to several hundred GHz (producing 100 s Watts at X-band frequencies). Preliminary microwave devices based on diamond have been demonstrated with a current gain cut-off frequency, $F_t$, above 11 GHz. However, these devices are not based on, nor optimised for, the state-of-the-art SC CVD diamond developed by the present applicant.

RF power devices require low parasitic capacitance and resistance, short transit time and low thermal resistance, and an ability to develop an extended high-field drift-region. The core physical parameters that affect the performance of the devices are shown in Table 1 below. The second column shows the influence of a given parameter on the device characteristics. In this table, the highest values will give rise to the best possible device. Diamond is outstanding in all the pertinent parameters.

For RF power applications the maximum field and the saturation velocity are the most important parameters to get power out of a device. Table 1 also shows the Johnson's figure of merit expected from the different materials. Up to now no divergence from this law has been observed. It is a physically-based model and only the thermal management leads to a discrepancy between experiment and the Johnson's figure of merit. The very high thermal conductivity of diamond ensures very little effect by this thermal limit. Diamond is the ultimate semiconductor for high power, high frequency devices and with operating frequencies extending far higher than 100 GHz.

Recent inventions of the present applicant, as disclosed in WO01/96633 and WO01/96634, represented a major breakthrough in the synthesis of ultra-high quality synthetic single crystal (SC) Diamond by chemical vapour deposition (CVD). This work has resulted in the production of large area freestanding SC CVD Diamond with carrier lifetimes and mobilities far exceeding even the most optimistic expectations and previous results on natural and other synthetic diamond.

TABLE 1

Comparison of material properties [R: series resistance, $f_t$ = current gain cut-off frequency, $I_{max}$ = maximum current density, $V_{max}$: maximum bias voltage, $P_{out}$ = maximum output power] Johnson's Figure of Merit, considers high power high speed operation, $(E_B V_{sat})^2$: 1/switch-loss and is a good relative comparison of the various semiconducting materials for use in RF power applications.

|  | Impact | Silicon | GaAs | 4H SiC | GaN | SC-CVD Diamond | Units |
|---|---|---|---|---|---|---|---|
| Maximum Electric Field | $P_{out}(V_{max})$ | 0.31 | 0.48 | 3 | 5 | 10-20 | MV/cm |
| Electron Mobility | R, $f_t$, $P_{out}(I_{max})$ | 1450 | 8600 | 900 | 2000 | 4500 | cm²/Vs |
| Hole Mobility | R, $f_t$, $P_{out}(I_{max})$ | 480 | 130 | 120 | 200 | 3800 | cm²/Vs |
| Saturation Velocity | $f_t$ | 0.86 | 0.72 | 2 | 2.5 | 2.7 | 10⁷ cm/s |
| Thermal Conductivity | $P_{out}(T)$, $f_t(T)$ | 1.5 | 0.46 | 5 | 1.3 | 24 | W/cmK |
| Johnson's FOM | ALL | 1 | 7 | 410 | 280 | 8200 | $(E_B V_{sat})^2$ |

The present invention utilises some of the technology disclosed in the above mentioned patent applications in combination with a number of new concepts to produce a diamond field effect transistor suitable for use in the amplification and switching of high frequency signals such as those used in radar, satellite communications and next generation mobile communications. In terms of frequency this corresponds to the frequency range 700 MHz to greater than 100 GHz. However the general device concepts also apply to devices operating at frequencies outside of this range, for example those used in high voltage switching.

The invention utilizes the recent breakthrough in the production of SC CVD diamond and uses a fabrication route consistent with this to produce a specific type of diamond transistor. In its simplest form there are three variants of this transistor which in this document will be referred to as SC CVD Diamond Transistor 1, SC CVD Diamond Transistor 2 and SC CVD Diamond Transistor 3.

Diamond compared with other semiconductors is comparatively difficult to dope, this is largely related to its bonding and its small lattice parameter which makes it hard to incorporate extrinsic impurities into the diamond lattice. However it has been shown in the relevant literatures that it is possible to dope diamond with Boron substituting for carbon atoms to give p-type conduction with a thermal activation energy of ~0.37 eV which falls to zero as the concentration increase above ~$10^{19}$ [B] cm⁻³. The three SC CVD Diamond Transistors described here use boron to provide holes that contribute to the conduction in the on-state.

However, one part of the invention relates to using an n-type layer. Both nitrogen and phosphorous can be incorporated into the diamond lattice onto substitutional sites which show n-type characteristics. In practice N and P doping leads to very deep donors (1.7 eV and 0.6 eV respectively), that provide few carriers at room temperature. However, these can still be of use in certain device designs. For example they can provide carriers if the device is operated at a high temperature or as in this invention they can be used to pin the Fermi energy in the upper part of the band gap to minimize leakage currents and transients below the depleted delta doped layers. The presence of the n-type layer also allows a bias to be applied to the base surface of the device. Such a layer is referred to as a 'shielding layer'.

Although there has been much comment in the literature about processing and contacting to diamond, these in conjunction with real active devices have had little attention. This invention presents a method for fabrication of Field Effect Transistors using CVD, utilising a route which is consistent with maximizing the material characteristics (i.e. high carrier velocities and high breakdown voltages) as well as issues related to etching and providing contacts to the diamond.

The transistors according to the invention either operate in depletion- or enhancement-mode, depending on the design details.

Figure 2:
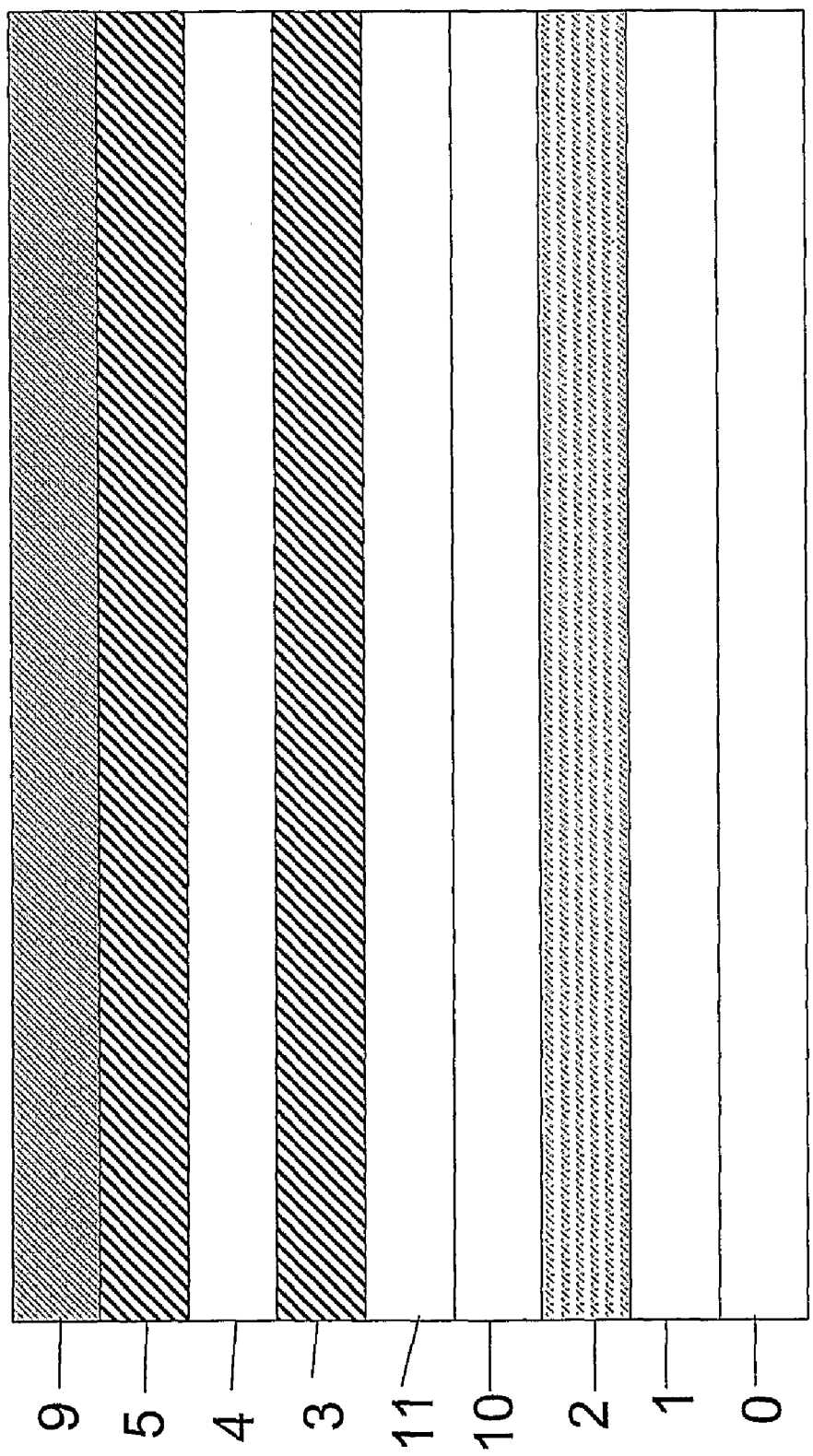
FIG. 2 is a schematic sectional diagram (not to scale) showing a plurality of layers of single crystal (SC) chemical vapour deposition (CVD) diamond layers needed to manufacture embodiments of transistors according to the invention.

FIG. 2 shows the basic layer structure used in manufacturing the transistors of the invention. The structure corresponds to layers 1 to 5 and 10 and 11 identified in Table 2 below. Depending on which embodiment of the invention is to be fabricated, one or more of the layers may be omitted. For example, in certain embodiments the second doped layer 5 is not used.

The first layer 1 of the structure is a substrate of low strain, low birefringence and low dislocation single crystal diamond material, having a very flat or smooth surface.

In a preferred embodiment of the invention, the growth of the several layers of CVD diamond material takes place on a diamond substrate having a surface which is substantially free of crystal defects. In this context, defects primarily mean dislocations and micro cracks, but also include twin boundaries, point defects not intrinsically associated with dopant N atoms or other dopant atoms intentionally present, low angle boundaries and any other extended disruption to the crystal lattice. Preferably the substrate is a low birefringence type Ia natural, Ib or IIa high pressure/high temperature synthetic diamond or a CVD synthesised single crystal diamond.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as $50/mm^2$ with more typical values being $10^2/mm^2$, whilst in others it can be $10^6/mm^2$ or greater.
2) Those resulting from polishing, including dislocation structures and microcracks forming chatter tracks along polishing lines. The density of these can vary considerably over a sample, with typical values ranging from about $10^2/mm^2$, up to more than $10^4/mm^2$ in poorly polished regions or samples.

The preferred low density of defects is such that the density of surface etch features related to defects, as described above, is below $5 \times 10^3/mm^2$, more preferably below $10^3/mm^2$, still more preferably below $5 \times 10^2/mm^2$ and most preferably below $10^2/mm^2$.

The defect level at and below the substrate surface on which the CVD growth takes place may thus be minimised by careful preparation of the substrate, and by use of a subsequent plasma etch which is preferably in situ. This is disclosed in detail in, for example, WO01/96633. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete.

Particular processing steps may include conventional diamond processes such as mechanical sawing, lapping and polishing (in this application specifically optimised for low defect levels), and less conventional techniques such as laser processing, reactive ion etching, ion beam milling or ion implantation and lift-off techniques, chemical/mechanical polishing, and liquid chemical processing techniques, plasma processing techniques, and high temperature-high pressure annealing techniques.

In addition, the surface $R_Q$ measured by stylus profilometer, preferably measured over 0.08 mm length) should be minimised, typical values prior to any plasma etch being no more than a few nanometers, i.e. less than 10 nanometers. $R_Q$ is the root mean square deviation of surface profile from flat (for a Gaussian distribution of surface heights, $R_Q = 1.25 R_A$: for definitions, see for example "Tribology: Friction and Wear of Engineering Materials", I M Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

1. an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes;
2. a hydrogen etch which is similar to (1) but where the oxygen is absent; and
3. alternative methods for the etch not solely based on argon, hydrogen and oxygen, for example, those utilising halogens, other inert gases or nitrogen.

The etch may consist of an oxygen etch followed by a hydrogen etch, a reactive-ion-etch (RIE) or an inductively-coupled plasma-etch (ICP), or some combination of the types of etch (then preferably moving directly into synthesis by the introduction of the carbon source gas).

As it is important to retain the smoothness provided by prior processing, the etch is preferably predominantly or wholly a hydrogen etch in the present method. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch may be aggressive, it is particularly important for this stage that the chamber design and material selection for its components be such that no material is transferred by the plasma from the chamber into the gas phase or to the substrate surface. The hydrogen etch, being less specific to crystal defects, rounds the angularities (including those caused by the oxygen etch, where used, which aggressively attacks such defects) and provides a smoother, better surface for subsequent growth.

Whilst the preferred etching strategy is the use of an oxygen etch followed by a hydrogen etch carried out in situ in the growth chamber immediately prior to starting the growth process, this does not preclude the use of ex situ RIE and/or ICP etches being carried out prior to the substrate being placed in the growth chamber. Indeed there may be benefits to using an ex situ etch, such as the availability of etchants that are less selective (in terms of direction or the rate at which defective material is preferentially etched) and/or faster and/or more controllable. The use of ex situ etching steps prior to the final in situ oxygen and hydrogen etching steps is specifically not excluded from this invention. The use of an ex situ etching step also provides the added benefit that the surface can be examined in a state that is much closer to that which is finally grown upon. Thus an alternative embodiment of the invention might comprise mechanically preparing the surface of a substrate, etching ex situ, optionally examining the surface to ensure that it is suitable for the growth of high quality single crystal CVD diamond, in situ oxygen and hydrogen etches (of shorter duration than in the preferred embodiment), and finally the growth of the high quality single crystal CVD diamond layer.

The substrate may comprise, in whole or in part, an n+ shielding layer (layer 2 in FIG. 2), which is typically doped with nitrogen or phosphorous and is typically located adjacent or close to the surface onto which the further diamond layers will be grown. In the embodiment where the whole substrate comprises the n+ shielding layer, the preferred thickness is between 100 μm and 5 mm. In the embodiment where only part of the substrate comprises the n+ shielding layer, the preferred thickness is between 1 nm and 150 nm. The preferred thicknesses of the n+ shielding layer in the two embodiments do not exclude the use of other thicknesses outside the preferred ranges.

The dopant concentration of the n+ shielding layer is preferably less than $5 \times 10^{19}$ cm$^{-3}$. The dopant concentration may be fixed, or it may vary linearly from one surface to another, or it may follow some other suitable dopant concentration profile or property profile. The shielding layer may be provided by CVD diamond growth, or by implantation, or by use of a pre-doped layer of diamond from any suitable source, onto which further diamond is attached by CVD methods to provide the bulk of the substrate, or may comprise the whole of the substrate and thus be diamond from any suitable source.

Substrates suitable for synthesising field effect transistors of the invention (layer 0 and/or layer 1 of FIG. 2) may be prepared as follows:

i) Selection of stock material (type Ia natural stones and type Ib HPHT stones) was optimised on the basis of microscopic investigation and birefringence imaging to identify substrates which were free of strain and imperfections.

ii) Laser sawing, lapping and polishing to minimise sub-surface defects using a method of a revealing plasma etch to determine the defect levels being introduced by the processing.

iii) After optimisation it was possible routinely to produce substrates in which the density of defects measurable after a revealing etch is dependent primarily on the material quality and is below $5 \times 10^3$/mm$^2$, and generally below $10^2$/mm$^2$. Substrates prepared by this process are then used for the subsequent synthesis.

An alternative source of substrates that would be suitable for this application has been described by the applicant in WO 2004/027123. Using the described method, substrates with lower dislocation density can be obtained.

It is also important to retain the flatness of the surface on which the device is being fabricated during the series of synthesis steps required for the structure. Each individual synthesis step may be optimised for flat growth, restricting growth steps to a few atoms high, preferably only two atoms high and even more preferably only one. Alternatively or in addition, the surface may be reprocessed after each growth step to provide a surface which is flat and parallel to the previous surface. In this case the reverse face of the substrate is used as a reference and all growth surfaces are prepared to be parallel to that surface.

The field effect transistors of the invention include at least one layer of high quality or intrinsic diamond material. Such an intrinsic diamond layer is preferably grown in accordance with the methods disclosed in WO 01/96633 and WO 01/96634, which are incorporated herein by reference. The layer is prepared by CVD and preferably in bulk form has at least one and more preferably two and most preferably three or more of the following characteristics:

(i) in the off state, a resistivity $R_1$ greater than $1 \times 10^{12}$ Ωcm, and preferably greater than $2 \times 10^{13}$ Ωcm, and more preferably greater than $5 \times 10^{14}$ Ωcm, typically measured at room temperature;

(ii) a high breakdown voltage in the off state, and high current with long carrier life time in the on state and, more particularly, a μτ product greater than $1.5 \times 10^{-6}$ cm$^2$/V, and preferably greater than $4.0 \times 10^{-6}$ cm$^2$/V, and more preferably greater than $6.0 \times 10^{-6}$ cm$^2$/V, all measured at 300 K. μ is the mobility and τ is the lifetime of the charge carriers, the product representing the contribution by a charge carrier to the total charge displacement or current. This characteristic can also be measured and expressed as a charge collection distance;

(iii) an electron mobility ($\mu_e$) measured at 300K greater than 2400 cm$^2$V$^{-1}$s$^{-1}$, and preferably greater than 3000 cm$^2$V$^{-1}$s$^{-1}$, and more preferably greater than 4000 cm$^2$V$^{-1}$s$^{-1}$. The technique used for measurement is that given in Isberg et al, Science, vol 297, pp 1670-1672;

(iv) a hole mobility ($\mu_h$) measured at 300 K greater than 2100 cm$^2$V$^{-1}$s$^{-1}$, and preferably greater than 2500 cm$^2$V$^{-1}$s$^{-1}$, and more preferably greater than 3000 cm$^2$V$^{-1}$s$^{-1}$. In high quality type IIa natural diamond hole mobilities are reported to be typically 1200 cm$^2$V$^{-1}$s$^{-1}$ at 300 K with exceptional values reported up to 1900 cm$^2$V$^{-1}$s$^{-1}$;

(v) a high charge collection distance greater than 150 μm, and preferably at least 400 μm, and more preferably at least 600 μm, all collection distances being measured at an applied field of 1 V/μm and 300 K. In high quality type IIa natural diamond, charge collection distances are reported to be substantially less than 100 μm, and more typically about 40 μm at 300 K and an applied field of 1 V/μm.

The characteristics listed above are characteristic of high-purity CVD-diamond layers with a thickness of approx. 100 μm, and might differ for layers thinner than that.

In a wide band gap electronic device such as one fabricated from diamond, the number of free charge carriers present under equilibrium conditions is extremely small and dominated by the contribution from lattice defects and impurities. Such a device is said to be in the "off-state". The device can be put into the "on-state" by the additional excitation of charge carriers by means such as optical excitation (primarily using optical energies near or greater than the band gap) or by charged particle excitation (e.g. alpha or beta particles). In the on-state the free carrier density exceeds the equilibrium level and when the excitation source is removed the device will revert to the off-state.

It will be noted from the above that the intrinsic diamond utilized in the method of the invention has electronic characteristics which are significantly superior to those generally present in natural high quality diamond. This provides the diamond with properties which are useful for producing the field effect transistors of the invention.

In addition to appropriate substrate material, it is also important in the method of the invention that the impurity content of the environment in which the CVD growth takes place is properly controlled. More particularly, for the intrinsic diamond layers the diamond growth preferably takes place in the presence of an atmosphere containing substantially no nitrogen, i.e. less than 300 parts per billion (ppb, as a molecular fraction of the total gas volume), and preferably less than 100 parts per billion. This method is discussed in detail in WO 01/99633 and WO 01/99634, referred to above.

The source gas may be any suitable gas or gas mixture known in the art and will contain a carbon-containing material which dissociates producing radicals or other reactive species. The gas mixture will also generally contain gases suitable to provide hydrogen or a halogen in atomic form.

The dissociation of the gas source may be carried out by any one of a number of methods known in the art, but is preferably carried out using microwave energy in a reactor which may be any known in the art. However, the transfer of any impurities from the reactor to the growing diamond should be minimized. A microwave system may be used to ensure that the plasma is placed away from all surfaces except the substrate surface on which diamond growth is to occur and its mount. Examples of preferred mount materials are: molybdenum, tungsten, silicon and silicon carbide. Examples of preferred reactor chamber materials are stainless steel, aluminium, copper, gold and platinum.

Where a microwave system is used, a high plasma power density should generally be used, resulting from high microwave power (typically 3-60 kW, for substrate diameters of 50-150 mm) and high gas pressures (50-500×$10^2$ Pa, and preferably 100-450×$10^2$ Pa).

Using the above conditions it has been possible to produce high quality single crystal CVD diamond layers with a value for the product of mobility and lifetime, $\mu\tau$, (measured in bulk layers) in excess of $1.5\times10^{-6}$ $cm^2/V$, e.g. $320\times10^{-6}$ $cm^2/V$ for electrons and $390\times10^{-6}$ $cm^2/V$ for holes.

The field effect transistors of the invention also include one or more boron doped layers, also referred to as 'delta' doped layers (e.g. layers 3 and 5 of FIG. 2).

It is important that such boron doped CVD diamond single crystal layers have sharp interfaces with adjacent layers as previously discussed, and have uniform dopant concentration both in the vertical direction (i.e. through the thickness of the layer, parallel to the growth direction) and laterally at least over the area of an individual device. In order to achieve these requirements, it is strongly preferred that growth takes place on a diamond surface which is substantially free of crystal defects, as already discussed previously.

In the context of boron doped layers, defects can degrade the material in two ways, adversely affecting the electronic properties (e.g. the hole mobility) and also influencing the local uptake of boron.

It is also important in the method of producing boron doped layers that the impurity content of the environment in which the CVD growth takes place is properly controlled. More particularly, the diamond growth must take place in the presence of an atmosphere containing substantially no contaminants, and the intentionally added boron (and nitrogen if used) concentrations must be suitably controlled.

The degree of control required for the boron and nitrogen dopant concentrations is application dependent, but typically needs to be stable to better than 20%, and more typically better than 10%, and even more typically better than 3%. Such control requires careful control of the nitrogen impurities in the source gas, as nitrogen is a common contaminant. In order to achieve this degree of control, the level of nitrogen in the source gas, prior to the deliberate nitrogen addition, is generally maintained at less than 500 parts per billion in the gas phase (as a molecular fraction of the total gas volume), and preferably less than 300 parts per billion, and more preferably less than 100 parts per billion. Measurement of absolute and relative nitrogen (and boron) concentrations in the gas phase at concentrations as low as 100 ppb requires sophisticated monitoring equipment such as that which can be achieved, for example, by gas chromatography, as is discussed fully in WO 03/052174, which is incorporated herein by reference.

Typically boron is added to the process as $B_2H_6$ using a calibrated source of nominally 100 ppm $B_2H_6$ in $H_2$ to simplify control, and likewise the nitrogen is added to the process as $N_2$ using a calibrated source of nominally 100 ppm $N_2$ in $H_2$ to simplify control. Additions of both B and N are expressed as ppm, calculated for B as $[B_2H_6]/[All\ gases]$ where $[B_2H_6]$ represents the number of moles of $B_2H_6$ and [All gases] represents the number of moles of all gases present, and likewise as $[N_2]/[All\ gases]$ for $N_2$. Any source of boron (or nitrogen, or phosphorus where these are the intended dopants) that is known in the art may be used for the synthesis of doped layers.

The gas mixture used in the synthesis process may contain any gases known in the art and will contain a carbon-containing material which dissociates producing radicals or other reactive species. The gas mixture will also generally contain gases suitable to provide hydrogen or a halogen in atomic form.

The dissociation of the source gas may be carried out by any one of a number of methods known in the art, but is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount, the substrate carrier. Examples of preferred mount materials include: molybdenum, tungsten, silicon and silicon carbide. Examples of preferred reactor chamber materials are stainless steel, aluminium, copper, gold and platinum.

The thin layers required for the active parts of the devices of this invention are ideally as close to monolayers as possible. The use of the techniques used for the deposition of bulk layers (e.g. thicknesses greater than 0.5 µm) is not appropriate under these circumstances. Whilst a plasma can be used to provide the active species for deposition of the layer, the layer's thickness, composition and quality needs to be controlled to a very high level and this may be best accomplished by operating under lower pressure conditions at lower power and with lower mass flow rates than would be typical for bulk deposition. A typical set of conditions might lie in range of a power of 0.1-5 kW from a 2.45 GHz microwave source, pressure of 3-10 kPa, and a total gas flow of 100-2000 sccm. The temperature at which deposition is occurs is maintained at between 400° C. and 1000° C. depending on the nature of the layer being deposited. The precise parameters required for each step are highly dependent upon the exact deposition system used, as would be well known to a person skilled in the art.

Using the above conditions is possible to produce both intrinsic and boron doped single crystal CVD diamond layers of high quality. The properties of intrinsic layers allow charge carriers to have an unusually high mobility and the boron doped layers are an effective source of large numbers of charge carriers that can easily be transported to the intrinsic layer. The arrangement of the layers with respect to each other is optimised to allow their use to create a field effect transistor.

In a further embodiment of the invention a layer of diamond or non-diamond passivating material (layer 9 in FIG. 2), which provides additional isolation between the Schottky gate and the two ohmic contacts, is provided. It preferably comprises a wide band-gap material and may be one or more of sapphire, n-type diamond, intrinsic diamond, silicon oxide, silicon carbide, gallium nitride, aluminium nitride, gallium aluminium nitride and boron nitride, for example. These layers can be put down by any one of a number of techniques known in the art. As described earlier, the substrate layer, layer 1, can be produced from a number of diamond materials, including HPHT and natural diamond. However it is generally more convenient and for some applications preferable to use CVD diamond. For simplicity a CVD diamond substrate will generally be presumed in the following description.

A CVD diamond layer, grown for use as substrate layer 1, will comprise typically one of the following:
  a. High purity diamond with a residual impurity concentration $<10^{15}$ cm$^{-3}$ or preferably $<10^{14}$ cm$^{-3}$ or more preferably $<5 \times 10^{13}$ cm$^{-3}$.
  b. In some cases this layer will be nitrogen doped in which case the nitrogen concentration will preferably be $<5 \times 10^{19}$ cm$^{-3}$ or more preferably $<5 \times 10^{18}$ cm$^{-3}$ or more preferably $<5 \times 10^{17}$ cm$^{-3}$ or most preferably $<5 \times 10^{16}$ cm$^{-3}$.
  c. A preferred embodiment in which the layer is nitrogen doped to a concentration of single substitutional nitrogen in solid as measured by the technique of electron paramagnetic resonance of preferably less than $5 \times 10^{17}$ cm$^{-3}$, more preferably less than $2 \times 10^{17}$ cm$^{-3}$ and which is preferably greater than $3 \times 10^{15}$ cm$^{-3}$, more preferably greater than $1 \times 10^{16}$ cm$^{-3}$ and most preferably greater than $5 \times 10^{16}$ cm$^{-3}$.
  d. In some cases the layer will consist of a high purity layer (defined by (a) above) and a thin doped shielding layer (layer 2 in FIG. 2) at the surface of the substrate layer 1 or part way through it. This shielding layer will contain an n-type dopant such as nitrogen or phosphorous (or some other suitable n-type dopant) with a concentration in the range $1 \times 10^{15}$-$1 \times 10^{19}$ cm$^{-3}$, the precise details being determined by the thickness of the layer, the carrier activation and its position below the next layer 3. In some cases it will be necessary to grade the doping in this layer 2, whereby the concentration changes by as much as a factor 10 000 over its thickness.

The substrate defines a growth surface on one face thereof. For subsequent homoepitaxial layers which form the basis of the active part of the device it is critical that the growth surface is as close to atomically flat/smooth as possible with a surface root mean square (rms) roughness <3 nm, or preferably <1 nm, or even more preferably <0.1 nm, or most preferably <0.05 nm.

The way in which this is achieved is also part of the invention. This is achieved by one or more of the following processes:
  a. Mechanical polishing using traditional methods known in the art.
  b. A combination of chemical, plasma and ion beam processing.
  c. Alignment of devices along crystallographic directions with low rms roughness.

The substrate layer 1 acts as a mechanical support for the subsequent layers which contribute to the active part of the device as well as providing a useful heat spreader for the power which is dissipated in the active layers.

These subsequent layers are summarized in Table 2.

TABLE 2

The layers which make up the SC CVD diamond Transistor.
The number scheme is consistent with FIGS. 2 to 5 and 9.

| CVD Layer | Function | Thickness (d) |
|---|---|---|
| 0 | Optional substrate for the growth of the preferred low birefringence, low dislocation density layer 1. The layer may be produced by a number of means. | D < 1 000 μm or preferably<br>d < 500 μm or more preferably<br>d < 250 μm or even more preferably<br>d < 150 μm |
| 1 | Substrate for mechanical support and thermal management, and defining a growth surface for further layers. It is preferred that this a low birefringence, low dislocation density CVD substrate with a nitrogen content as below:<br>[N.] < 5 × 10$^{17}$ cm$^{-3}$ or preferably<br>[N] < 2 × 10$^{17}$ cm$^{-3}$ and<br>[N] > 3 × 10$^{15}$ cm$^{-3}$ or preferably<br>[N] > 1 × 10$^{16}$ cm$^{-3}$ or more preferably<br>[N] > 5 × 10$^{16}$ cm$^{-3}$ | D < 1 000 μm or preferably<br>d < 500 μm or more preferably<br>d < 250 μm or even more preferably<br>d < 150 μm |
| 2 | Optional n+ shielding layer - within or at the surface of the substrate<br>[N/P/S] < 1 × 10$^{20}$ cm$^{-3}$ or preferably<br>[N/P/S] < 5 × 10$^{18}$ cm$^{-3}$ or more preferably<br>[N/P/S] < 5 × 10$^{17}$ cm$^{-3}$ | D < 150 μm or preferably<br>d < 20 μm or even more preferably<br>d < 1 μm |

TABLE 2-continued

The layers which make up the SC CVD diamond Transistor.
The number scheme is consistent with FIGS. 2 to 5 and 9.

| CVD Layer | Function | Thickness (d) |
|---|---|---|
| | and preferably [N/P/S] > $1 \times 10^{15}$ cm$^{-3}$ | |
| 10 | Optional further substrate layer above n+ shielding layer. | Typically conforming to the specification of layer 1 |
| 11 | Optional intrinsic diamond layer. [B, N, other impurities] < $1 \times 10^{16}$ cm$^{-3}$ or preferably [B, N, other impurities] < $5 \times 10^{15}$ cm$^{-3}$ or more preferably [B, N, other impurities] < $5 \times 10^{14}$ cm$^{-3}$ or even more preferably [B, N, other impurities] < $5 \times 10^{13}$ cm$^{-3}$ or most preferably [B, N, other impurities] < $1 \times 10^{12}$ cm$^{-3}$ | D < 1000 nm or preferably d < 200 nm or more preferably d < 100 nm or even more preferably d < 50 nm or most preferably d < 10 nm |
| 3 | B doped layer (source of holes) [B] > $1 \times 10^{17}$ cm$^{-3}$ or preferably [B] > $1 \times 10^{18}$ cm$^{-3}$ or more preferably [B] > $1 \times 10^{19}$ cm$^{-3}$ or even more preferably [B] > $5 \times 10^{19}$ cm$^{-3}$ or most preferably [B] > $5 \times 10^{20}$ cm$^{-3}$; and [N, other impurities] < $5 \times 10^{16}$ cm$^{-3}$ or preferably [N, other impurities] < $5 \times 10^{15}$ cm$^{-3}$ or more preferably [N, other impurities] < $5 \times 10^{14}$ cm$^{-3}$ or even more preferably [N, other impurities] < $5 \times 10^{13}$ cm$^{-3}$ or most preferably [N, other impurities] < $1 \times 10^{12}$ cm$^{-3}$ | D < 20 nm or preferably d < 10 nm or more preferably d < 5 nm or even more preferably d < 2 nm or most preferably d < 0.8 nm |
| 4 | Intrinsic diamond layer forming Intrinsic Channel [B, N, other impurities] < $1 \times 10^{16}$ cm$^{-3}$ or preferably [B, N, other impurities] < $5 \times 10^{15}$ cm$^{-3}$ or more preferably [B, N, other impurities] < $5 \times 10^{14}$ cm$^{-3}$ or even more preferably [B, N, other impurities] < $5 \times 10^{13}$ cm$^{-3}$ or most preferably [B, N, other impurities] < $1 \times 10^{12}$ cm$^{-3}$ | D < 1000 nm or preferably d < 200 nm or more preferably d < 100 nm or even more preferably d < 50 nm or most preferably d < 10 nm |
| 5 | B doped layer (for ohmic contacts) [B] > $1 \times 10^{17}$ cm$^{-3}$ or preferably [B] > $5 \times 10^{18}$ cm$^{-3}$ or more preferably [B] > $5 \times 10^{19}$ cm$^{-3}$ or even more preferably [B] > $5 \times 10^{20}$ cm$^{-3}$ or most preferably [B] > $5 \times 10^{21}$ cm$^{-3}$ | d < 1000 nm or preferably d < 100 nm or more preferably d < 25 nm or more preferably d < 10 nm or most preferably d < 5 nm |
| 6 | Ohmic forming contact | WSi or W or Mo or Ti or Pt or graphite or B or Al or Au |
| 7 | Capping bonding layer | Au or Al or Au or other suitable metal. |
| 8 | Schottky Gate Contact | Al or Au or Pt or Ni or refractory metals |
| 9 | Gate dielectric layer. Preferably a wide bandgap material. | May be non-diamond such as one of sapphire, silicon carbide, gallium nitride, aluminium nitride, gallium aluminium nitride, boron nitride. May also be intrinsic diamond or n-type diamond |

Several specific embodiments of the invention will now be described in greater detail.

SC CVD Diamond Transistor 1

Figure 3:
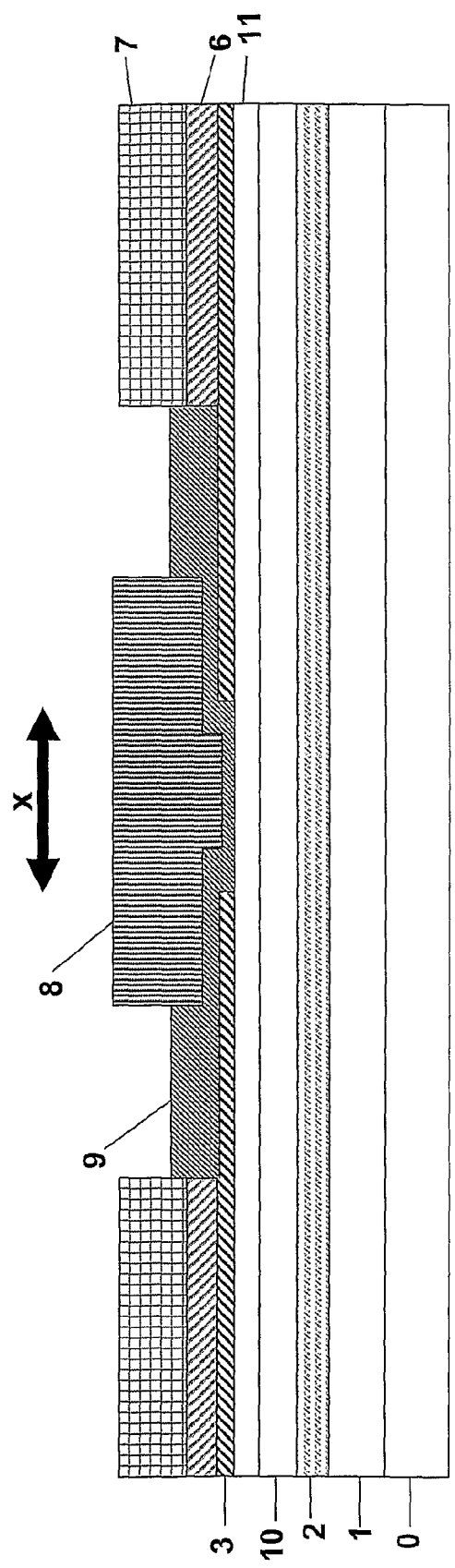
FIG. 3 is a schematic sectional view of a first embodiment of a diamond transistor according to the invention.

The structure of a first embodiment of a single crystal CVD diamond transistor, referred to as SC CVD Diamond Transistor 1, is shown in FIG. 3. The numbering of the layers is consistent with that of the layers listed in Table 2.

The structure of the SC CVD Transistor 1 is a three terminal device with ohmic contacts which act as source and drain terminals, and with a Schottky gate contact positioned between the source and drain. In the terminology this design can be referred to as a metal insulator field effect transistor (MISFET).

With reference to FIG. 3 the device comprises the following:

1. An optional layer 0 which may be, for example, a HPHT diamond;
2. A layer 1 of high purity CVD diamond;
3. A layer 2, an optional shielding layer formed on the layer 1;

Layers 0 and 1 comprise the substrate and the major surfaces are as close to parallel as possible at this stage.

4. A layer 10, an additional layer of high purity diamond, similar to that of the layer 1, that is deposited on the layer 2;

In an alternative embodiment, the layer 2 is formed below the surface of the substrate 1.

5. A layer 11, an intrinsic layer formed directly on the upper surface of the layer 10. The growth surface of the layer 11 is preferably reprocessed at this stage to ensure parallelism of the structure with the reverse surface of the substrate acting as the reference surface. Such reprocessing needs to achieve the desired thickness for the layer 11, the desired surface smoothness, and minimize the introduction of subsurface damage;
6. A layer 3 is deposited on top of the layer 11 after it has been suitably processed. The layer 3 is a delta doped layer as described in Table 2. A trench is formed in the layer 3, either by masking when the layer 3 is deposited or by etching the layer 3 after deposition thereof, to define a gate region. It is important to ensure that beneath this trench is intrinsic diamond, i.e. that none of the delta doped layer remains, but also that the trench bottom aligns closely to the bottom surface of the delta doped layer and does not extend excessively beyond it. In particular it is required to minimize the step down into the intrinsic diamond at the edge of the recess. Preferably this step will not exceed 10 nm, and more preferably not exceed 5 nm, and more preferably not exceed 2 nm, and most preferably not exceed 1 nm. The bottom of the trench can show a small degree of curvature down into the intrinsic diamond, although this is preferably minimized;
7. A layer 9 of insulating material is then deposited over the trench and the adjacent portions of the delta doped layer 3. The insulating layer 9 may be non-diamond, and be made of, or some combination of, sapphire, silicon carbide, gallium nitride, aluminium nitride gallium aluminium nitride and boron nitride. Alternatively it may be diamond in which case it may be intrinsic diamond and form part of the active channel, which may relax the conditions necessary in controlling the step at the edge of the channel when forming the channel, or it may be n-type diamond. A further alternative is that it may comprise a diamond layer and then a non diamond layer;
8. A metallic gate contact 8 is formed above the gate region on the layer 9, and ohmic source and drain contacts each comprising layers 6 and 7 according to Table 2 are made to spaced apart regions of the exposed delta doped layer 3. It is required that the gate contact 8 does not make electrical contact with the delta doped layer 3.

The intrinsic diamond channel of this device is effectively defined by the upper region of the layer 11 in the region of the recess or trench in the delta doped layer 3, and may additionally be in the region of the gate dielectric layer 9 within the break of the delta doped layer if this region comprises intrinsic diamond.

The channel current flowing in the intrinsic diamond channel is controlled by the gate voltage. In standard terminology this is called a charge injection PIP MISFET. Essential to the concept of a PIP transistor based on space charge limited carrier transport are:

a channel in the intrinsic diamond layer 11 that is near the surface of the intrinsic diamond adjacent to the delta doped layer 3, and a source-drain spacing, x in FIG. 3 (i.e. gate length), which is as small as possible consistent with the operational voltage of the device. The distance represented by x, corresponding to the width of the break in the delta doped layer, is crucial to the design. Typically x will be less than 2 µm, more typically less than 500 nm, even more typically less than 150 nm and most preferably less than 20 nm.

Prior to the formation of the layer 9, the exposed diamond surface of the layer 11 that will eventually be beneath the gate (layer 8 in FIG. 3) can be terminated in a number of ways known in the art, and in particular it can be hydrogen terminated, oxygen terminated, or un-terminated (i.e. a bare diamond surface).

This device requires at least one sharply defined interface being that between the intrinsic layer 11 and the delta doped layer 3.

SC CVD Diamond Transistor 2

Figure 4:
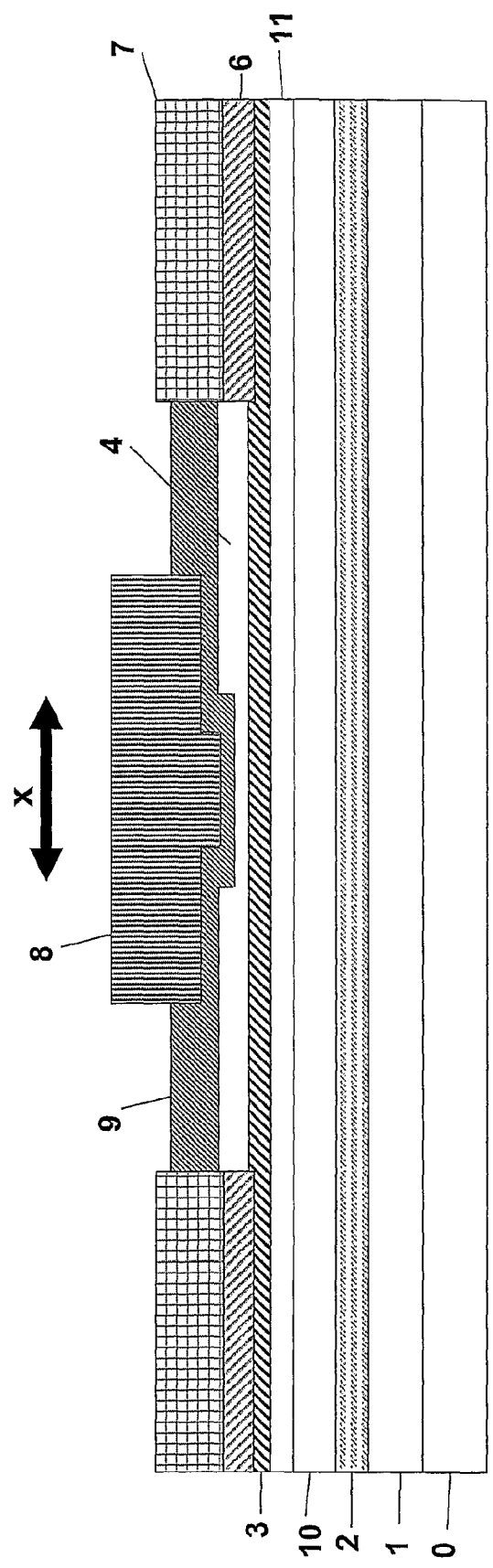
FIG. 4 is a schematic sectional view of a second embodiment of a diamond transistor according to the invention.

The SC CVD Diamond Transistor 2 is shown in section in FIG. 4. This embodiment incorporates a delta-doped layer 3 and an intrinsic layer 4, grown on top of the delta-doped layer 3. The interfaces between layers 3 and 4 and between layers 3 and 11 need to be as sharp as possible, as has been previously described. The possible variations to this structure will now be described in more detail.

The substrate layer 1 may include within the bulk or at the upper surface a shielding layer 2 (in FIG. 4 the variation shown is a shielding layer 2 at the upper surface of the substrate layer 1 and a further substrate layer 10 has been grown on top of the shielding layer). Preferably an intrinsic layer 11 is grown onto the substrate layer 10, although a working device structure can be prepared by placing the delta doped layer 3 directly onto the substrate layer 1 or more preferably the shielding layer 2.

After growing the intrinsic layer 11, the growth surface is preferably reprocessed to achieve parallelism of the surface with the reverse surface of the substrate acting as the reference surface. Such reprocessing needs to achieve suitable thickness for the layer 11, suitable surface smoothness, and minimize the introduction of subsurface damage.

The delta doped layer 3 is then formed with a sharp interface to the layer beneath. Mechanical reprocessing of the surface after the delta doped layer is not normally applied, since the layer is so thin.

A further intrinsic layer 4 is then grown onto the delta doped layer, ensuring a sharp interface. This layer is typically very thin, e.g. 10 nm. Again, as this is a thin layer the surface is not normally mechanically reprocessed for parallelism, and the parallelism is now generally less critical.

Ohmic source and drain contacts each comprising an ohmic forming layer 6 and preferably a capping bonding layer 7 are made directly on the delta doped layer 3. This can be achieved, for example, by etching the intrinsic channel layer 4 following growth thereof or by selective deposition of the layer 4 using, for example, masking of the contact regions before deposition. Alternatively the contacts may be fabricated before the deposition of the layer 4 and thus themselves act as the mask. Etching of the layer 4 is relatively difficult to complete sufficiently accurately due to the thinness of this layer and the layer 3.

A gate recess is preferably fabricated, for example by reactive ion etching or Ar sputtering. Typically the thickness of the intrinsic layer 4 in the gate region is reduced to a few nm, for example 1-2 nm. One benefit of the Schottky gate contact being a recessed design is that it enables greater field strengths to pinch off the channel without exceeding the breakdown voltage of diamond.

The SC CVD Diamond Transistor 2 can be made with or without a gate dielectric layer 9 (the embodiment shown in FIG. 4 has a gate dielectric layer 9). The Schottky gate contact 8 can either be made directly on the intrinsic layer 4, or made on the layer 9 as illustrated in FIG. 4.

The gate dielectric layer 9, if used, will preferably be made of, or some combination of, sapphire, silicon carbide, gallium nitride, aluminium nitride, intrinsic diamond, n-type diamond, gallium aluminium nitride and boron nitride.

The width of the trench forming the gate recess is normally referred to as the gate length. The gate length is preferably less than 500 nm, more preferably less than 250 nm, more preferably less than 100 nm, more preferably less than 50 nm, more preferably less than 20 nm, and most preferably less than 10 nm.

SC CVD Diamond Transistor 3

Figure 5:
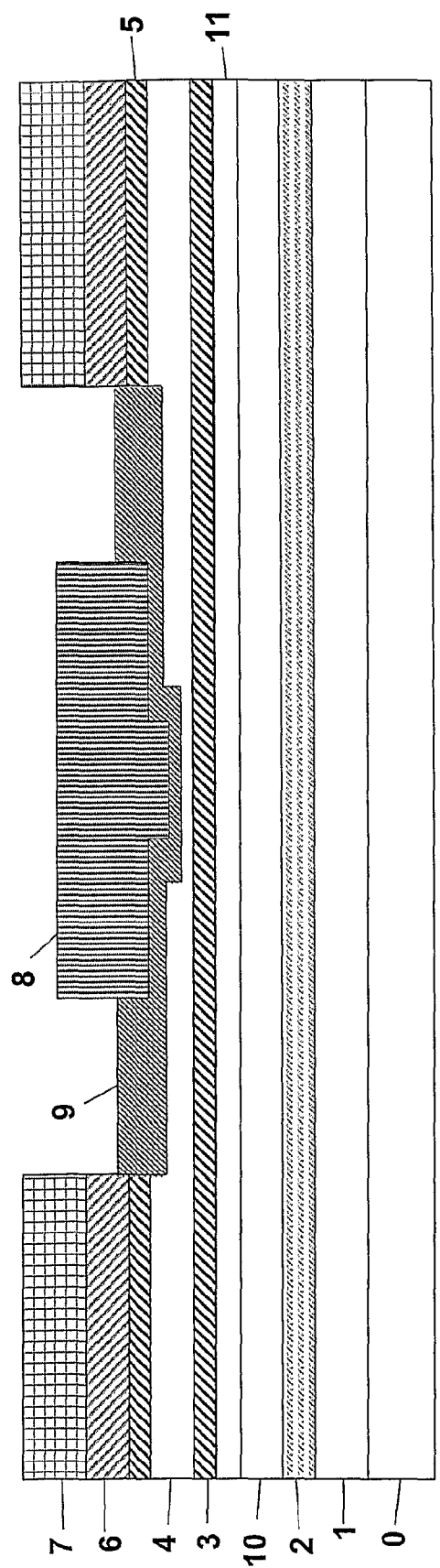
FIG. 5 is a schematic sectional view of a third embodiment of a diamond transistor according to the invention, manufactured using the schematic layer structure of FIG. 2.
Figure 6:
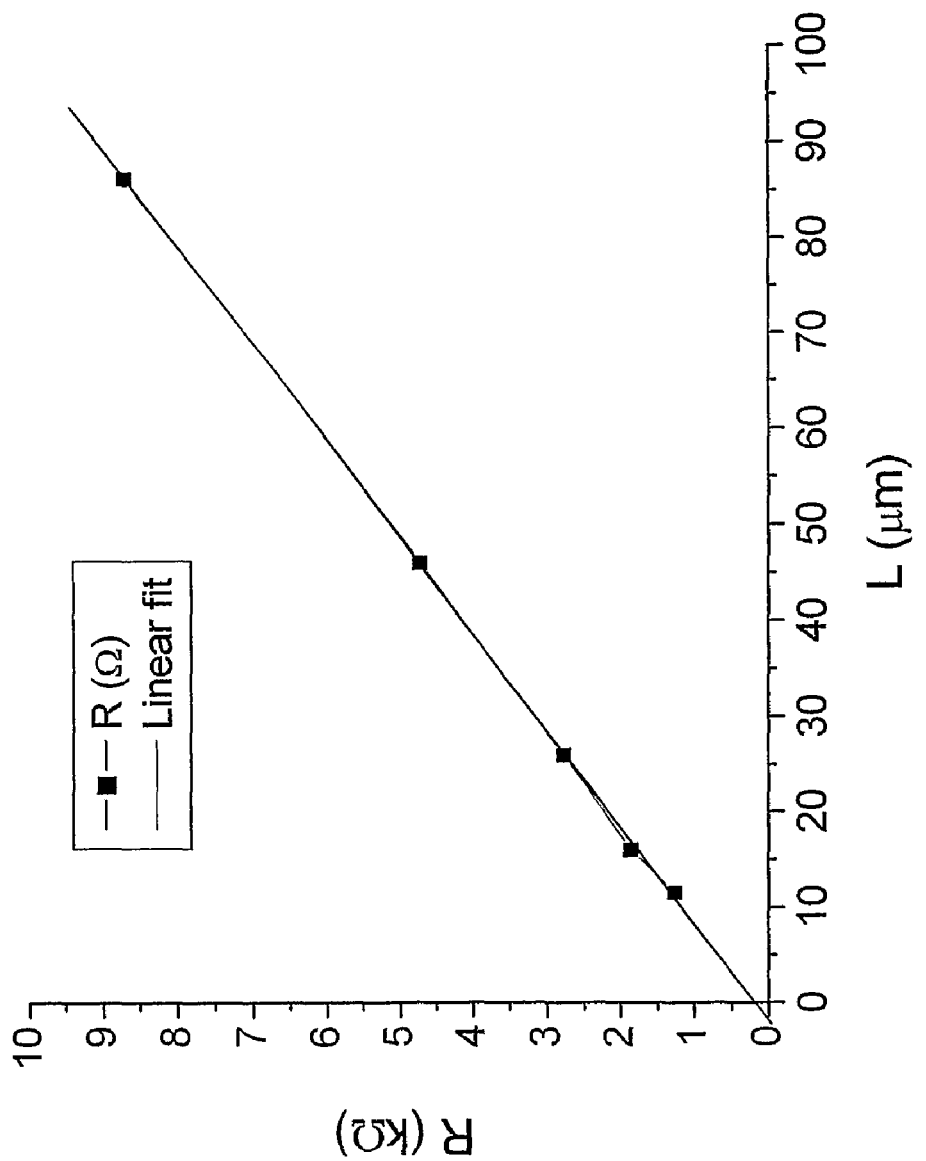
FIG. 6 is a graph showing the contact resistance of the ohmic contacts of a diamond transistor similar to the diamond transistor of FIG. 3.

The structure of the SC CVD Transistor 3 is shown in section in FIG. 5. As with the previous devices it is a three terminal device with ohmic contacts which act as source and drain terminals, and with a Schottky gate contact positioned between the source and drain.

The SC CVD Diamond Transistor 3 in FIG. 5 differs from the SC CVD Diamond Transistor 2 of FIG. 4 in that the intrinsic layer 4 defining the channel is overgrown by another boron delta doped layer 5. Ohmic source and drain contacts comprising layers 6 and 7 are then directly deposited on the boron delta doped layer 5. A substantial portion of the delta doped layer 5 is etched or removed in some way to enable the Schottky gate contact to be made to the intrinsic channel layer 4. In one version of the method the delta doped layer 5 is made by selective deposition which eliminates any need to etch boron doped diamond.

The other details of the transistor of FIG. 5 are similar to those of the transistor of FIG. 4.

The benefit of this design is that overlap of the out diffusion of carriers from the two delta doped layers forms an electrical connection between them, and applying the second delta doped layer avoids the need to process down to expose the first layer.

Figure 9:
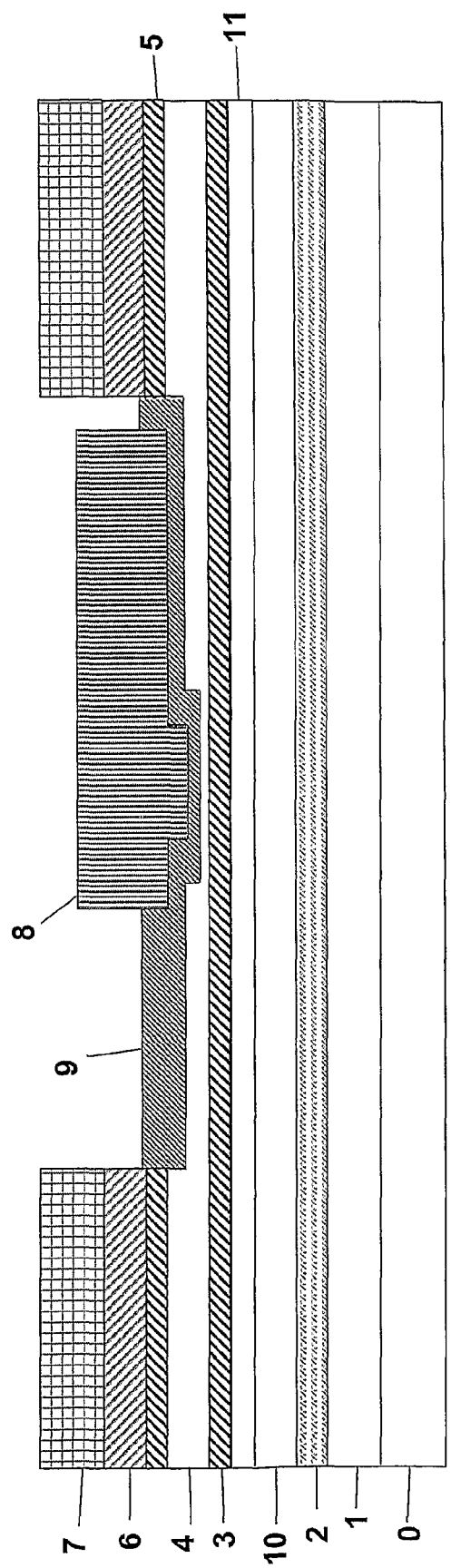
FIG. 9 is a schematic sectional view of a variation of the embodiments shown in FIGS. 3, 4 and 5.

All of the embodiments described above can benefit from the variation shown in FIG. 9. This figure illustrates the use of the Schottky gate-contact as a so-called field plate. This field plate is fabricated like the Schottky contacts described above and is preferably used in combination with a gate recess. This represents one example of a field plate, and others known in the art might be applied. See, for example, Umesh K. Mishra, 'Status of AlGaN/GaN HEMT Technology-A UCSB perspective', GAAS 2005 Proceedings, p 21-26.

One aspect of the invention is the method by which the sharp thin layers are deposited. In order to achieve the necessary sharp layers (both doped and intrinsic) gas phase engineering is necessary. Methods by which this is achieved include:

a. Pulsing the doping gas.
b. Pulsing the microwave power to move from one plasma deposition scheme to the next.
c. Moving the sample from a chamber used for doped material synthesis to a chamber used for intrinsic material synthesis. This transfer may be via an external environment or the two chambers may be connected, and the process (such as a plasma) in each chamber may run continuously during the sample movement or stop before transfers.
d. Inserting a solid source of boron or doping object into the plasma.
e. Altering the gas phase composition by introducing a doping gas into the process.
f. Moving the sample in and out of the growth regime while keeping a stable plasma.
g. Using deposition techniques such as vapour transport deposition onto heated surfaces which have a low growth rate.
h. Synthesis of the layer followed by material removal using techniques such as laser ablation, etching and mechanical processing.

However fabrication of these devices is not trivial, since the delta doped layer is very thin and etching down and forming metal contacts onto this layer is very difficult. A desirable solution is in forming a common structure suitable for the further fabrication of a range of devices, such as the series of layers shown schematically in FIG. 2, and then from this fabricating the individual device designs such as those illustrated in FIGS. 3 to 5 and 9.

Although the bulk of the layers that constitute the active part of the described transistors are thin, these layers can differ widely in doping concentrations. This difference can lead to stress and potentially reduce the carrier properties in the subsequent layers. Although in some cases these layers will be pseudo-morphic and will not lead to stress propagation this is not true for all embodiments of this invention. In order to minimize this stress, methods of isotopic engineering can be used. For example doping with boron leads to a distortion of the diamond lattice but this can be mitigated by matching the lattice parameter by altering the $^{12}C$ and $^{13}C$ ratio for the boron doped layer or the adjacent intrinsic diamond layer. Alternatively, or in combination, the isotope ratio of $B^{10}/B^{11}$ in the doped layer may be varied.

It will be understood by those skilled in the art that more than one device can be made on a diamond wafer. The devices can be separated by mesa etching down to the intrinsic layer 1 defining the substrate.

The synthesis and processing steps can be applied to one, two or more devices at a time. By fabricating devices from a common basic structure such as the series of layers shown schematically in FIG. 2 it is possible to fabricate a range of different device structures on a single wafer.

The specific contact resistance for the ohmic contacts of a device similar to the SC CVD Diamond Transistor 1 using WSi to form the ohmic contacts was measured to be less than $10^4$ Ohm cm$^2$. WSi is a preferred contact for use in the devices of this invention because of a number of advantages. Diamond does not generally grow on WSi, so that this contact material also makes an effective mask, useful for example in CVD Diamond Transistor 1 and CVD Diamond Transistor 2. It also makes an excellent ohmic contact, and is high temperature stable and compatible with general semiconductor processing technology, and in particular the technology relevant to the processing of diamond.

Figure 7:
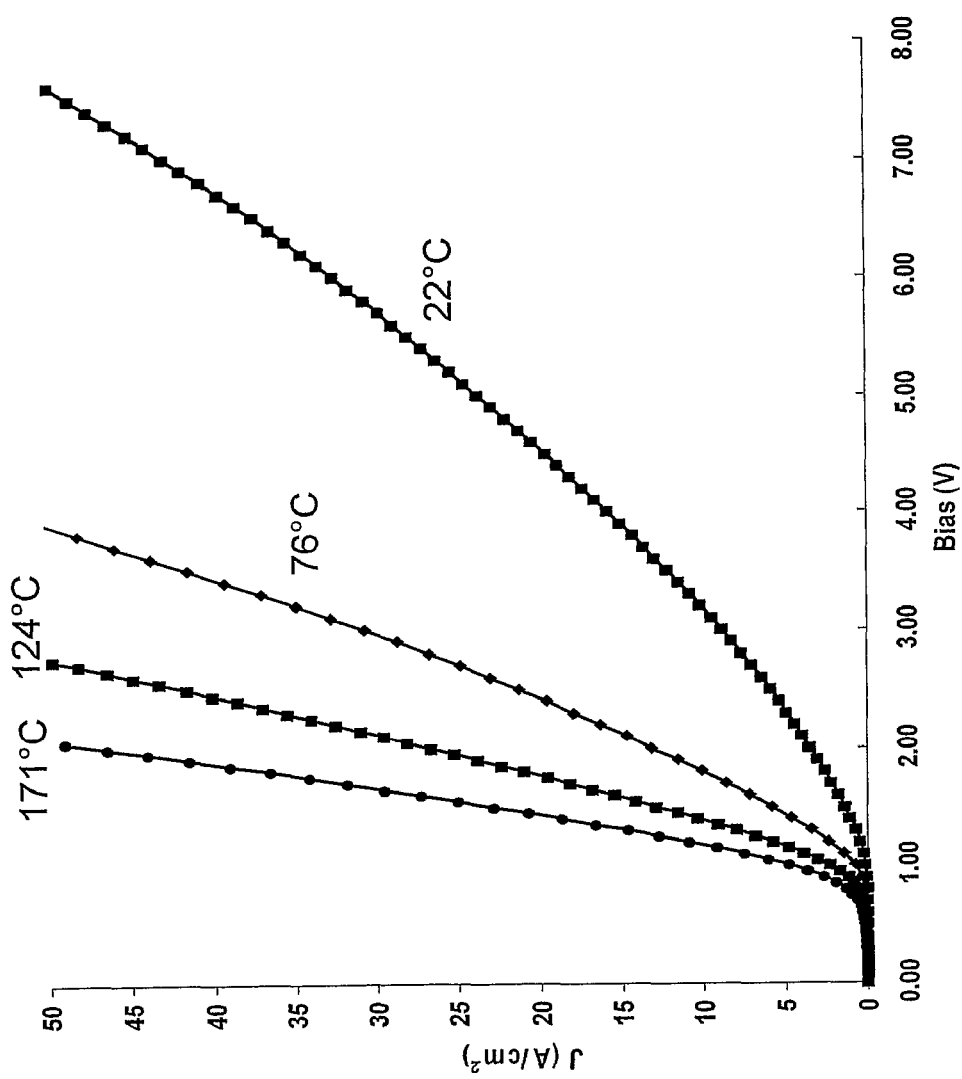
FIG. 7 is a graph illustrating the performance of aluminium Schottky contacts as a function of temperature in the transistors of the invention.

Aluminium Schottky contacts are evaluated as a function of temperature in FIG. 7. This data corresponds to a Schottky barrier height of ~1.3 eV. The preferred Schottky contacts are fabricated from AlI, Ni or Au, with Al most preferred.

Figure 8:
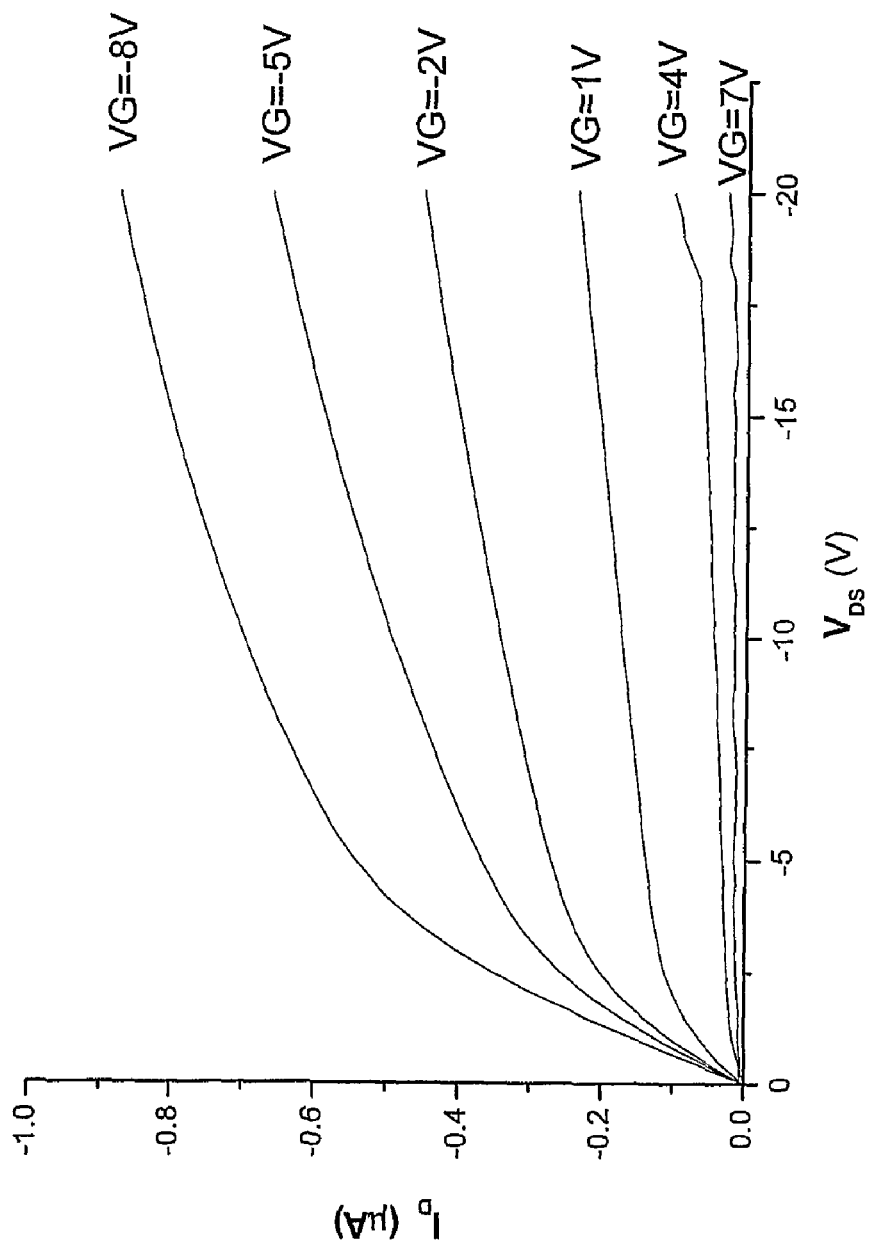
FIG. 8 is a graph illustrating the I/V characteristics of a diamond transistor similar to the transistor of FIG. 3.

Experimental data showing I/V characteristics of a single crystal CVD diamond transistor similar to SC CVD Diamond Transistor 1 is shown in FIG. 8. In some cases it is found that annealing the material structure prior to device fabrication improves the device performance. This is associated with the annealing out of shallow and deep traps that reduce the carrier concentration and mobility in the intrinsic channel.

EXAMPLE

A specific example of a MESFET that has been fabricated together with its expected performance is given below. This example is intended to be non-limiting.

The design of the device is very similar to that of the SC CVD Transistor 1 shown in FIG. 3, as this is the simplest of the devices proposed by the applicant.

An HPHT substrate 1 with major faces (001) was carefully prepared by scaif polishing along one of the <100> directions lying in the plane of the substrate and an $R_A$ value, measured using an atomic force microscope, of less than 0.3 nm was achieved. This surface roughness was achieved over areas of greater 50 μm×50 μm, more than large enough for fabricating single devices.

Using conditions known in the art for depositing high quality intrinsic single crystal CVD diamond (see WO 01/96633), a layer 11 approximately 1 μm thick was deposited on the specially prepared substrate surface. On top of the intrinsic layer 11, a high boron delta doped layer 3, approximately 10 nm thick, was deposited. The boron concentration in the delta doped layer was measured by secondary ion mass spectroscopy (SIMS) to be in excess of $5 \times 10^{19}$ cm$^{-3}$. SIMS depth profiling showed that the boron concentration rose from about $10^{16}$ cm$^{-3}$ (at the interface between the intrinsic layer and the delta doped layer) to $5 \times 10^{19}$ cm$^{-3}$ in a distance of approximately 2 nm. For the device to function, the boron concentration of the delta doped layer needs to be greater than $1 \times 10^{19}$ cm$^{-3}$, and this concentration is used to define the edge of the delta doped layer.

On top of the delta-doped layer, a further intrinsic layer, to form the gate dielectric layer 9, was deposited, using similar conditions to that used for the first intrinsic layer 11. In this case the layer thickness was approximately 30 nm. Using SIMS depth profiling the boron concentration was found to fall from a value of $1 \times 10^{19}$ cm$^{-3}$ at the interface to less than $10^{18}$ cm$^{-3}$ over a distance of approximately 3 nm. The boron concentration decreases slightly less rapidly than it rises and the boron concentration in the intrinsic gate dielectric layer 9 is slightly higher than in the first intrinsic layer 11. Both of these features impact on the ultimate performance of the device but neither prevents its operation.

A channel was then prepared by selectively etching an area of the gate dielectric layer 9 by reactive ion etching using an argon-oxygen plasma and a photoresist mask. Good control of this process resulted in the thickness of the gate dielectric layer in the gate area being 1-2 nm.

Using standard processes, an aluminium gate contact 8 and WSi source and drain contacts 7 were applied.

The source-drain current, $I_{SD}$, was used to assess the performance of the device. $I_{SD}$ was measured to be greater than 30 mA/mm.

The parameters which were not measured were modeled to be $f_T$=26 GHz and $P_{OUT}$=7 W/mm and the applicant believes that values close to the modeled values will be achieved.

The invention claimed is:

1. A method of manufacturing a transistor including the steps of:
    (a) providing a substrate comprising single crystal diamond material having a growth surface on which further layers of diamond material can be deposited, the growth surface or a region thereof having a root-mean-square roughness of 3 nm or less or being free of steps or protrusions larger than 3 nm, wherein said growth surface or region having a root-mean-square roughness of 3 nm or less or being free of steps or protrusions larger than 3 nm comprises a source-gate-drain region of the transistor;
    (b) depositing a plurality of further diamond layers on the substrate growth surface including at least one boron delta-doped layer and at least one adjacent layer of device grade or intrinsic diamond, with sharply defined interfaces between the respective layers, wherein the height of any step or protrusion on the growth surface of one of the layers on which a further layer is deposited is less than 50% of the thickness of the thinnest adjacent layer, a step or protrusion being defined as the change in height of the surface over a distance, parallel to the surface, equal to the thickness of the thinnest adjacent layer; and
    (c) attaching appropriate contacts to the respective diamond layers, thereby defining a transistor structure.

2. A method according to claim 1 wherein the growth surface or region thereof has a root-mean-square roughness of less than 0.5 nm.

3. A method according to claim 2 wherein the growth surface or region thereof has a root-mean-square roughness of less than 0.1 nm.

4. A method according to claim 1 wherein the height of any step or protrusion on the growth surface is less than 50% of the thickness of the thinnest adjacent layer, a step or protrusion being defined as the change in height of the growth surface over a distance, parallel to the surface, equal to or greater than the thickness of the thinnest adjacent layer.

5. A method according to claim 4 wherein a step or protrusion is defined as the change in height of the growth surface over a distance, parallel to the surface, equal to at least twice the thickness of the thinnest adjacent layer.

6. A method according to claim 1 wherein the gate length or another linear feature of the transistor is arranged in a direction corresponding to the direction of the growth surface of the substrate that has the lower surface roughness or lower maximum step height.

7. A method according to claim 1 wherein the growth surface or region thereof has a dislocation density of less than $5 \times 10^3$ mm$^{-2}$.

8. A method according to claim 1 wherein the substrate includes single substitutional nitrogen at a concentration of less than $5 \times 10^{17}$ cm$^{-3}$.

9. A method according to claim 1 wherein the substrate includes single substitutional nitrogen at a concentration of greater than $3 \times 10^{15}$ cm$^{-3}$.

10. A method according to claim 1 wherein the substrate has a birefringence, exemplified by the modulus of the sine of the phase shift, of less than 0.9.

11. A method according to claim 1 wherein the substrate material comprises diamond produced by HPHT or CVD processes.

12. A method according to claim 1 including forming an n+ shielding layer at or adjacent the surface of the substrate.

13. A method according to claim 12 including doping the shielding layer with nitrogen or phosphorous.

14. A method according to claim 13 wherein the dopant concentration in the shielding layer is less than $1\times10^{20}$ cm$^{-3}$ and the thickness of the shielding layer is less than 150 μm.

15. A method according to claim 1 wherein the surface of the substrate is processed to the required smoothness by controlled etching and/or growth techniques.

16. A method according to claim 15 wherein the controlled etching and/or growth techniques include plasma etching and low rate growth.

17. A method according to claim 16 further including mechanical polishing of the substrate surface.

18. A method according to claim 1 wherein the surface of the substrate is processed to the required smoothness by off-axis polishing combined with controlled etching and/or growth.

19. A method according to claim 18 wherein the surface smoothness of the substrate is distinct in different directions.

20. A method according to claim 1 including fabricating at least a region to be used for an active area of the transistor structure on a diamond substrate material comprising a single growth sector, and controlling the growth sector.

21. A method according to claim 20 wherein the whole surface of a wafer used for fabrication of the active areas of a plurality of the transistor structures is formed from a single growth sector, and the growth sector is controlled.

22. A method according to claim 20 wherein the orientation of the substrate surface, and thus the growth sector selected for fabrication of the active area(s) of the transistor structure(s), corresponds to any one of the primary growth sectors for CVD diamond synthesis, i.e. the growth sectors {100}, {110}, {113} or {111}.

23. A method according to claim 20 wherein the orientation of the substrate surface, and thus the growth sector selected for fabrication of the active area(s) of the transistor structure(s), lies within 15° of one of the primary CVD growth sectors {100}, {110}, {113} or {111}.

24. A method according to claim 23 wherein the primary growth sector is the {100} sector.

25. A method according to claim 23 wherein the primary growth sector is the {111} sector.

26. A method according to claim 23 wherein the direction of offset of the substrate surface from the selected primary growth sector lies within 15° of the great circle passing through the selected primary growth sector and one of the other primary growth sectors.

27. A method according to claim 26 wherein the selected primary growth sector is the (001) sector, and the direction of offset of the substrate surface from the selected (001) primary growth sector lies within 15° of the great circle passing through the selected (001) primary growth sector and either the a) (111) and (110) crystallographic orientations or the b) (−111) and (−110) crystallographic orientations.

28. A method according to claim 27 wherein the gate length of the transistor is oriented in the case of a) along the [−110] direction or in the case of b) along the [110] direction.

29. A method according to claim 1 wherein at least one layer of device grade or intrinsic diamond material defining a channel is deposited on the layer of delta doped diamond material.

30. A method according to claim 29 wherein the layer of device grade or intrinsic diamond material defining the channel has a thickness of less than 1000 nm.

31. A method according to claim 30 wherein the layer of device grade or intrinsic diamond material defining the channel has a thickness of less than 100 nm.

32. A method according to claim 31 wherein the layer of device grade or intrinsic diamond material defining the channel has a thickness of less than 10 nm.

33. A method according to claim 32 wherein the layer of device grade or intrinsic diamond material defining the channel has a thickness of less than 2 nm.

34. A method according to claim 29 including forming a Schottky gate contact in a recess adjacent the channel.

35. A method according to claim 34 including forming and exposing the channel using laser ablation, induced graphitization and chemical etching, reactive ion etching, or inductive coupled plasma processing, in combination with lithography techniques.

36. A method according to claim 34 including forming the gate contact by depositing a metallization layer comprising aluminum, gold or platinum on the layer of device grade or intrinsic diamond material defining the channel.

37. A method according to claim 34 including depositing a layer of non-diamond passivating material over the channel to provide additional isolation between the Schottky gate contact and the channel.

38. A method according to claim 37 wherein the passivating material is a wide band-gap material selected from the group comprising sapphire, n-type diamond, intrinsic diamond, silicon carbide, gallium nitride, aluminum nitride, gallium aluminum nitride and boron nitride.

39. A method according to claim 29 wherein a further solid layer is applied to the intrinsic diamond layer defining the channel.

40. A method according to claim 39 wherein the further solid layer is in the form of contact metallisation.

41. A method according to claim 39 wherein the further solid layer is in the form of a gate dielectric.

42. A method according to claim 39 wherein the further solid layer is a further diamond layer.

43. A method according to claim 1 wherein the delta doped layer has a dopant concentration greater than $1\times10^{17}$ atoms cm$^{-3}$.

44. A method according to claim 1 wherein the delta doped layer has a dopant concentration less than $5\times10^{21}$ atoms cm$^{-3}$.

45. A method according to claim 1 wherein the device grade or intrinsic diamond comprises high purity diamond with a residual impurity concentration of less than $1\times10^{16}$ cm$^{-3}$.

46. A method according to claim 1 wherein the surface of any layer on which a further layer is to be deposited has a root-mean-square roughness of 3 nm or less or is free of steps or protrusions larger than 3 nm.

47. A method according to claim 1 wherein the at least one delta doped layer is deposited on an adjacent intrinsic layer and the doping concentration falls by at least 1 order of magnitude in a distance less than 20% of the layer thickness between the delta doped layer and the intrinsic layer.

48. A method according to claim 1 wherein the at least one intrinsic layer is deposited on an adjacent delta doped layer and the doping concentration rises to at least $1\times10^{18}$ cm$^{-3}$ in a distance less than 10 nm.

49. A method according to claim 1 wherein the thickness of each of the delta doped layers is less than 100 nm.

50. A method according to claim 49 wherein the thickness of each of the delta doped layers is less than 20 nm.

51. A method according to claim 50 wherein the thickness of each of the delta doped layers is less than 5 nm.

52. A method according to claim 49 wherein the thickness of each of the delta doped layers is less than 1 nm.

53. A method according to claim 1 including depositing at least two ohmic source and drain contacts on the respective diamond layers.

54. A method according to claim 34 wherein the ohmic contacts are each deposited directly onto a first doped layer.

55. A method according to claim 1 wherein the further diamond layers deposited on the substrate include a first delta doped layer and a second delta doped layer separated by an intrinsic diamond layer across which current flows because of overlap of charge carriers out-diffused from the delta doped layers, wherein the second delta doped layer is utilized or easily accessible for formation of metallization or other contacts connecting the device to external circuits, and is interrupted in a gate region of the device.

56. A method according to claim 55 including forming at least one tunneling contact through a metal carbide interface.

57. A method according to claim 56 wherein the metal of the tunneling contact comprises titanium, chromium, nickel or WSi.

58. A method according to claim 56 wherein the metal of the tunneling contact is capped with another metal selected from the group including platinum, gold and aluminum.

59. A method according to claim 1 wherein the delta doped layer is an interrupted delta doped layer deposited on an intrinsic diamond layer.

60. A method according to claim 59 wherein a step is defined by a gate recess at the interface between the interrupted delta doped layer and the intrinsic diamond layer, the recess having a depth of less than 5 nm.

61. A method according to claim 1 further comprising incorporating a field plate or edge termination structure within the transistor.

62. A method according to claim 1 further comprising incorporating a back contact within the transistor using an n-type conducting substrate.

63. A method according to claim 62 wherein N is used as the dopant for forming the n-type conducting substrate.

64. A method according to claim 1 wherein the transistor structure defines a field effect transistor.

65. A high frequency transistor produced by the method of claim 1, with a threshold frequency $F_T$ lying in the range of 0.1-500 GHz, and a maximum output power $P_{max}$ lying in the range 0.05 W/mm to 1000 W/mm, wherein the product of the threshold frequency in GHz and the maximum output power in W/mm, $F_T \times P_{max}$, exceeds 0.005.

66. A high frequency transistor according to claim 65 wherein the product of the threshold frequency in GHz and the maximum output power in W/mm, $F_T \times P_{max}$, exceeds 0.05.

67. A high frequency transistor according to claim 66 wherein the product of the threshold frequency in GHz and the maximum output power in W/mm, $F_T \times P_{max}$, exceeds 50 000.

68. A high frequency transistor produced by the method of claim 1, wherein the product of a threshold frequency $F_T$ in GHz and a maximum output power $P_{max}$ in W/mm, $F_T \times P_{max}$, does not exceed $10^6$.

69. A high frequency transistor according to claim 68 wherein the product of the threshold frequency in GHz and the maximum output power in W/mm, $F_T \times P_{max}$, does not exceed $10^5$.

70. A high frequency transistor according to claim 69 wherein the product of the threshold frequency in GHz and the maximum output power in W/mm, $F_T \times P_{max}$, does not exceed $10^4$.

71. A high frequency transistor according to claim 70 wherein the product of the threshold frequency in GHz and the maximum output power in W/mm, $F_T \times P_{max}$, does not exceed $10^3$.

72. A high frequency transistor produced by the method of claim 1, with a threshold frequency $F_T$ lying in the range of 0.1-500 GHz, and a maximum output power $P_{max}$ lying in the range 0.05 W/mm to 1000 W/mm, wherein the product of the threshold frequency in GHz and the total device power $P_{dev}$ in W, $F_T \times P_{dev}$, exceeds 0.005.

73. A high frequency transistor according to claim 72 wherein the product of the threshold frequency in GHz and the total device power $P_{dev}$ in W, $F_T \times P_{dev}$, exceeds 5.

74. A high frequency transistor according to claim 73 wherein the product of the threshold frequency in GHz and the total device power $P_{dev}$ in W, $F_T \times P_{dev}$, exceeds 50 000.

75. A high frequency transistor produced by the method of claim 1, with a threshold frequency $F_T$ lying in the range of 0.1-500 GHz, and a power $P_{max}$ lying in the range 0.05 W/mm to 1000 W/mm, wherein the product of the threshold frequency in GHz and the total device power $P_{dev}$ in W, $F_T \times P_{dev}$, does not exceed $10^6$.

76. A high frequency transistor according to claim 75 wherein the product of the threshold frequency in GHz and the total device power $P_{dev}$ in W, $F_T \times P_{dev}$, does not exceed $10^5$.

77. A high frequency transistor according to claim 76 wherein the product of the threshold frequency in GHz and the total device power $P_{dev}$ in W, $F_T \times P_{dev}$, does not exceed $10^4$.

78. A high frequency transistor according to claim 77 wherein the product of the threshold frequency in GHz and the total device power $P_{dev}$ in W, $F_T \times P_{dev}$, does not exceed $10^3$.

* * * * *